United States Patent [19]

Shapanus et al.

[11] Patent Number: 5,550,631
[45] Date of Patent: Aug. 27, 1996

[54] INSULATION DOPING SYSTEM FOR MONITORING THE CONDITION OF ELECTRICAL INSULATION

[76] Inventors: Vincent F. Shapanus, 716 Morningside Dr., Towson, Md. 21204; Kevin J. Phipps, 1114 Halstead Rd., Baltimore, Md. 21234

[21] Appl. No.: 475,205

[22] Filed: Jun. 7, 1995

Related U.S. Application Data

[63] Continuation-in-part of Ser. No. 210,027, Mar. 17, 1994.
[51] Int. Cl.$^6$ .............................. G01J 3/00; G01N 21/00
[52] U.S. Cl. ............................................. 356/300; 73/86
[58] Field of Search ............................ 250/358.1, 338.1, 250/227.11, 227.15, 302–303; 356/300, 311, 72, 36; 73/86, 7; 60/271, 223; 239/71, 265.11

[56] References Cited

U.S. PATENT DOCUMENTS

| | | |
|---|---|---|
| 2,577,814 | 12/1951 | Saunderson et al. . |
| 2,774,276 | 12/1956 | Glasser et al. . |
| 2,951,164 | 8/1960 | Timms . |
| 2,975,785 | 3/1961 | Sheldon . |
| 3,144,551 | 8/1964 | Webb et al. . |
| 3,244,894 | 4/1966 | Steele et al. . |
| 3,407,323 | 10/1968 | Hand . |
| 3,413,481 | 11/1968 | Berry . |
| 3,527,954 | 9/1970 | Hoffman . |
| 3,528,749 | 9/1970 | Bowker . |
| 3,613,062 | 10/1971 | Bloice . |
| 3,636,345 | 1/1972 | Hirschel . |
| 3,684,378 | 8/1972 | Lord . |
| 3,690,772 | 9/1972 | Endl . |
| 3,745,816 | 7/1973 | Erickson et al. ............. 356/72 |
| 3,824,391 | 7/1974 | Noltingk et al. . |
| 3,973,849 | 8/1976 | Jackson et al. . |
| 3,986,777 | 10/1976 | Roll . |
| 4,047,819 | 9/1977 | Goldberg . |
| 4,131,367 | 12/1978 | French et al. . |
| 4,176,369 | 11/1979 | Nelson et al. . |
| 4,280,184 | 7/1981 | Weiner et al. . |
| 4,396,903 | 8/1983 | Habicht et al. . |
| 4,555,800 | 11/1985 | Nishikawa et al. . |
| 4,561,104 | 12/1985 | Martin . |
| 4,575,241 | 3/1986 | Demers et al. . |
| 4,907,281 | 3/1990 | Hirvonen et al. . |
| 4,912,326 | 3/1990 | Naito . |
| 5,015,859 | 5/1991 | Uejio ............................ 250/358.1 |
| 5,187,542 | 2/1993 | Madzar ......................... 356/300 |
| 5,198,666 | 3/1993 | Bateman . |
| 5,577,815 | 12/1951 | Saunderson et al. . |

*Primary Examiner*—K. Hantis
*Attorney, Agent, or Firm*—Reed Smith Shaw & McClay

[57] ABSTRACT

A method and apparatus for monitoring the condition of an electrical generator having at least one conductor. An insulator is provided for surrounding the conductor, the insulator includes a light generating material for producing a distinctive optical signature when the insulator degrades. An optical acquisition device is provided for acquiring the optical signature when the insulator degrades. A light detector means is coupled to the optical acquisition device and detects and then converts the optical signature to an electrical signal. A signal processor, responsive to the electrical signal, then monitors degradation of the insulator by sensing the electrical signal.

9 Claims, 18 Drawing Sheets

INSULATION DOPING SYSTEM FOR MONITORING THE CONDITION OF ELECTRICAL INSULATION

This is a continuation-in-part of copending application Ser. No. 08/210,027 filed on Mar. 17, 1994.

FIELD OF THE INVENTION

This invention relates to monitoring of physical conditions within a predetermined space by collection and detection of optical radiation emitted within the space. More particularly, this invention relates to monitoring the condition of a piece of electrical equipment by collecting and detecting optical radiation generated at various locations on or in the equipment. Still more particularly, this invention relates to monitoring an electrical machine, such as a generator, to determine the existence of corona discharge, electrical arcing, flame ignition combustion, or smoldering conditions, by collecting light emitted at various locations within the machine and analyzing the collected light to determine whether its characteristics are consistent with such conditions. As used herein, "optical radiation" and "light" include visible light and adjacent wavelength ranges of electromagnetic radiation.

BACKGROUND OF THE INVENTION

There is a great need to determine the condition of certain electrical equipment such as generators and motors. High voltage generators such as are used by electric power utilities are subject to faults and deterioration which can be relatively easily corrected if detected sufficiently early but which can lead to catastrophic failure if left uncorrected. A variety of techniques have been employed to monitor the condition of such equipment in order to evaluate whether or when maintenance should be performed. Such techniques generally measure, directly or indirectly, the quality of the electrical insulation of the equipment. A high voltage generator, such as a 13.2 kV generator used by an electrical utility, includes insulated conductors which are disposed in slots in laminated steel structures. During generator operation, the insulation is subjected to a very large cyclic compressive load. This is a result of the mechanical forces generated by the interaction between the electrical current in the conductor and the magnetic field. Such stresses, together with time and environmental conditions, eventually result in deterioration of the insulation sufficient to permit corona generation. For purposes of the present invention, the term "corona" means a localized electrical discharge in a gaseous region adjacent an electrical circuit which occurs due to transient ionization of the gas when the voltage stress in the gas exceeds a critical value, for instance an electric field of about 3000 V/m in air. The corona itself typically causes further insulation degradation which, if unabated, will result over time in an arc, spark or flame in the equipment which causes an equipment failure. Thus, for purposes of the present invention, a corona or corona ionization may be thought of as a first step in an evolutionary process which, in time, may result in an arc, spark or flame in the equipment being monitored. Although the term "corona" may be used to refer to internal discharges, such usages of "corona" must be distinguished from corona which occurs externally. External corona refers to characteristics of the corona phenomenon which occur on the surface of the insulation. External corona is sometimes referred to as partial discharge. Corona that is not visible because it is internal to a material or device can also be referred to as partial discharge. In this specification, "corona" refers to external corona, i.e, exposed ionization. While certain measures can be taken to suppress external corona ionization, such as applying semiconductive paint over the insulation, they generally merely extend the time until corona occurs.

In rotating machinery, such as high-voltage motors or generators, conductors are insulated with layers of insulating tape which is mica based and impregnated with a polymer that has a high dielectric strength which is inherent to the monomer components of the polymer or to the modifiers which may be added to increase the dielectric strength upon polymerization of the monomer compound. Conductors that have been treated with an insulating system are driven into the slots in laminated steel structures. These stator-bar conductors must carry a cyclic compressive load. This is a result of the transmission of mechanical forces resulting from the interaction of the current and magnetic field to the iron of the generator or the opposite affect. Semiconductive paints are used to suppress corona between the insulation system and the slots. In most cases, the paint is vaporized over prolongation of the ionization. Corona is undesirable and will degrade the insulation due to ion bombardment over time.

Currently, insulation can be divided into six classes. However, these six classes have yet to become the industry standard. The industry is currently using four class divisions. Class A insulation is comprised of organic materials such as cotton, paper and silk. This type of insulation is not used in new generators. Class B insulation is a group consisting of synthetic materials such as mica, glass fiber and epoxy. Some organic materials are also included in this class. Class B insulation is the most widely used insulation today. Class F insulation is made up of similar materials that are in Class B insulation. These materials have different characteristics than those in Class B. Generally, Class F insulation can withstand an additional 25 degrees centigrade over Class B insulation. Class H insulation is also comprised of similar materials as in Class B insulation. Class H insulation has additional additives that suppress combustion. The proposed six class division separates Class H insulation into two other classifications that are loosely based on further temperature divisions. Insulation systems are usually mica or mica based products which have been impregnated with a plastic in a compression process. Insulating tapes used in an insulation system that covers the outer surface of conductors contain inorganic materials, even so, corona ionization will eventually occur on such materials.

Corona is a serious problem, and can lead to rapid and catastrophic failure of a generator. Accordingly, generator condition monitoring has included corona detection and monitoring of corona-related conditions. For the most part, prior corona detection techniques have required the generator to be taken out of service, which is a substantial disadvantage. One technique is to visually inspect the generator windings to detect the effects of corona on the insulation; corona may leave a white residue. Visual inspection may require substantial disassembly of the generator to access locations where corona may occur, and the visual evidence of corona may be overlooked. Another corona detection technique which requires the generator to be out of service is electrical measurement of the insulation electrical characteristics from which inferences regarding the insulation quality and susceptibility to corona may be drawn. D.C. potentials may be applied to the windings for measurements of charging and static resistive currents; A.C. potentials may be applied to the windings to make insulation power factor measurements; or overvoltages may be applied to determine if the insulation can survive them. A further drawback of these electrical testing methods is that they do not provide information regarding the physical location at which an insulation problem may exist; thus they do not provide information to direct repair and maintenance activities to the appropriate locations. Other techniques may be used to detect corona based on the effects it produces while it is occurring; these include detecting radio or ultrasonic noise emitted by the corona. These monitoring techniques also require the electrical load to be removed from the generator, and it is still difficult to locate a corona-generating region using them. Coronas generate ozone, and the tell-tale odor of ozone has long been used as an indicator of corona. It is difficult to quantify the degree of insulation deterioration and to localize a deteriorated area by detecting corona-generated ozone.

Corona also generates light, and corona detectors which acquire and detect light have been used in research studies regarding corona physics. However, to date optical corona detectors have not been available which can detect corona in an operating electrical machine such as a generator and determine the location where the corona exists.

Utility generators can be taken off line for inspection, testing, maintenance, and repair in the spring and fall, when demand is relatively low, but it is inconvenient and expensive to do so in the summer and winter peak demand seasons. Accordingly, the generators are typically kept on line during the peak seasons, and any minor insulation defects which are overlooked or are incipient and undetectable in the spring and fall can grow to serious or catastrophic problems during the following peak season. Such problems are exacerbated by the fact that there is presently negligible construction of new power plants in the United States; old plants and their generators are therefore being kept on line indefinitely, and the aging equipment is increasingly susceptible to insulation deterioration. When a catastrophic generator failure occurs, it can require eighteen months off line and tens of millions of dollars to repair.

Accordingly, there is a great need for a system for continuously monitoring the condition of a generator while it is in normal operation, which can detect and evaluate the severity and location of corona and related conditions, so that problems can be identified early, monitored during their evolution, emergency action can be taken if necessary, and otherwise repair and maintenance can be scheduled when appropriate, performed efficiently and effectively, and orderly utility operations maintained.

It is therefore an overall object of the invention to provide a system for detecting corona in electrical machinery while the machinery is in normal operation.

It is a further object of the invention to provide a system which can detect arcing, flame ignition combustion, and smoldering conditions as well as corona.

It is another object of the invention to provide a system for detecting corona ionization emissions from an electrical power generator, which system can be installed on the electrical power generator without modifying or altering the design or structure of the generator.

It is another object of the invention to provide a system which can determine the location(s) within the machinery at which corona or other insulation defect-related conditions are occurring.

It is another object of the invention to provide such a system which can determine the identity of materials which are involved in corona or other insulation defect-related conditions.

It is another object of the invention to provide such a system which can determine the intensity or severity of corona or other insulation defect-related conditions.

It is another object of the invention to enhance the optical visibility of corona ionization emissions that occur within electrical power generating equipment by treating the insulation used in such equipment with materials which emit a distinctive optical signature during corona ionization emissions.

It is another object of the invention to provide such a system which displays information relating to the intensity and location of corona or other insulation defect-related conditions.

It is another object of the invention to use a single optical sensor which is coupled to a plurality of fiber optical devices with different fields of view for monitoring and determining the location(s) within the machinery where corona ionization emissions are occurring. It is a still further object of the present invention to provide means for selectively suppressing optical signals from one or more of such fiber optical signals from reaching the single optical sensor. It is yet a further object of the present invention to provide means for optically isolating different optical signals from the plurality of fiber optical devices on discrete non-overlapping areas of the single optical sensor.

It is another object of the invention to provide such a system which stores information relating to the condition of the monitored electrical machinery.

It is another object of the invention to provide such a system which is rugged and can reliably operate in the hostile environment of many electrical machines.

The foregoing and other objects of the invention will be understood with reference to the following specification and claims and the drawings.

SUMMARY OF THE INVENTION

The present invention is directed to a method and apparatus for monitoring the condition of an electrical generator formed of a stator core punching assembly having a plurality of winding slots for receiving a plurality of generator windings. The plurality of winding core slots lie along an interior cylindrical surface of the stator core punching assembly, and the stator core punching assembly has an outer cylindrical surface opposite the interior cylindrical surface. The stator core punching assembly also has a plurality of internal vent openings extending from the outer cylindrical surface toward the inner cylindrical surface. In accordance with the present invention, a first optical probe is disposed outside of the stator core punching assembly and is formed of a plurality of optical acquisition devices each of which is formed from at least one optical fiber strand. Each of the optical acquisition devices is disposed to acquire light generated at one of the winding slots and passing through one of the internal vent openings.

In accordance with a further aspect, the present invention is directed to a method and apparatus for monitoring the condition of an electrical generator having at least one conductor. An insulator is provided for surrounding the conductor, the insulator includes a light generating material for producing a distinctive optical signature when the insulator degrades. An optical acquisition device is provided for acquiring the optical signature when the insulator degrades. A light detector means is coupled to the optical acquisition device for detecting the optical signature and converting it to an electrical signal. A signal processor, responsive to the electrical signal, then monitors degradation of the insulator.

In accordance with a still further aspect, the present invention is directed to a method and apparatus for selectively blocking an optical light signal provided from an input fiber optical strand. An input fiber termination port is provided for coupling the input fiber optical strand to an optical switch. An output fiber termination port is provided for coupling an output fiber optical strand to the optical switch. An interior optical path transmission region forms part of the optical switch. The interior optical path transmission region is bounded on a first end by the input fiber termination port, on a second end by the output fiber termination port, and by an outer enclosure assembly. A moveable light blocking structure is positioned within the interior optical path transmission region for selectively blocking an optical signal from passing between the input fiber optical strand and the output fiber optical strand.

In accordance with still yet a further aspect, the present invention includes an apparatus for isolating and sensing the outputs of a plurality of adjacent fiber optical strands. Aligning means are provided for aligning termination ends of the plurality of adjacent fiber optical strands with a plurality of light reception areas on a CCD array. Each of the light reception areas on the CCD array is associated with one of the plurality of adjacent fiber optical strands and is formed of one or more pixels from the CCD array. A pixel selecting means is provided for identifying pixels in the CCD array that potentially are positioned within more than one of the plurality of light reception areas. A signal processor is coupled to the CCD array and the pixel selecting means. The signal processor includes means for zeroing all pixel output signals from the CCD array associated with pixels identified by the pixel selecting means, and means for determining an amplitude of light received at each of the light reception areas. For each of the light reception areas, the means for determining combines all non-zeroed pixel output signals from the CCD array that are associated with a light reception area.

DETAILED DESCRIPTION OF THE INVENTION

While the following description may refer specifically to the monitoring of a generator, it will be understood that the system of the invention may be used to monitor other electrical machinery and equipment.

Figure 1:
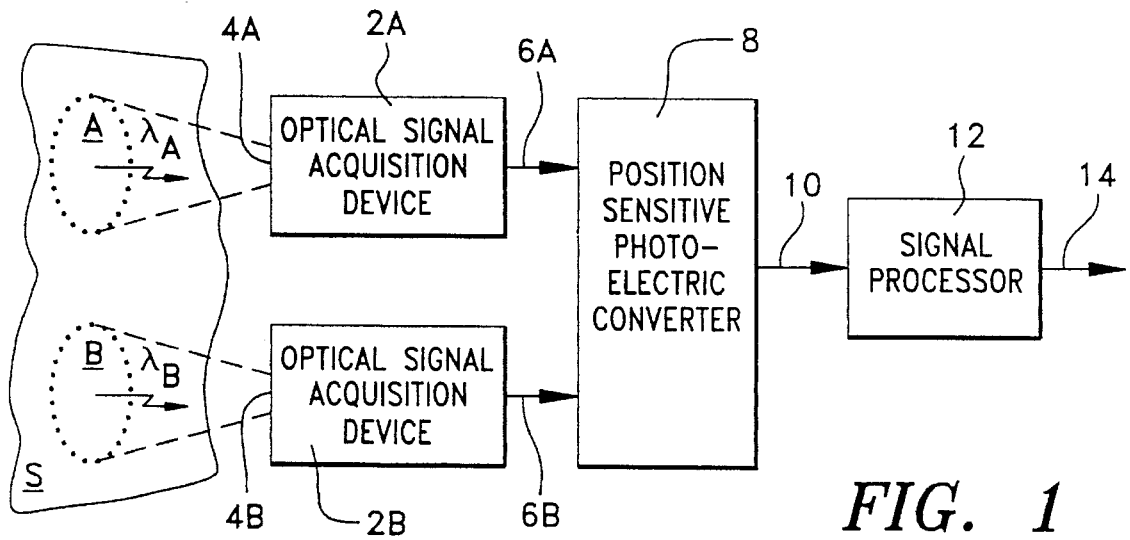
FIG. 1 is a schematic diagram illustrating a system for monitoring the condition of a piece of electrical equipment in accordance with a preferred embodiment of the present invention.

Referring now to FIG. 1, there is shown a schematic diagram illustrating a system for monitoring the condition of a piece of electrical equipment in accordance with a preferred embodiment of the present invention. The system includes a monitoring instrument, a portion of which is disposed adjacent to a surface S which is to be monitored. Surface S includes a plurality of areas, areas A and B being shown, which are to be separately monitored. Areas A and B may, for example, be different areas within a generator or other electrical machinery or equipment. The system includes a plurality of optical signal acquisition devices, 2A and 2B being shown, which are disposed and adapted to separately receive optical radiation, indicated as $\lambda A$ and $\lambda B$, emitted in their direction from the corresponding areas A and B to be monitored. Optical signal acquisition device 2A includes an aperture 4A through which it receives light from a field of view which includes area A on surface S, and optical signal acquisition device 2B includes an aperture 4B through which it receives light from a field of view which includes area B of surface S. Optical signal acquisition devices 2A and 2B are preferably disposed with respect to surface S so that the areas A and B in their respective fields of view are different, although they may overlap. The optical radiation received by optical signal acquisition devices 2A and 2B is separately conveyed over optical communication channels 6A and 6B to a position-sensitive photoelectric converter 8, so as to preserve the spatial information regarding the source of the light. Although optical signal acquisition devices 2A and 2B are required to be adjacent the surface to be monitored, which is often a hostile environment, the optical communication channels 6A and 6B permit the photoelectric converter and associated electronics to be disposed in a remote location which is likely to be less hostile. Converter 8 converts the optical radiation received from the optical communication channels 6A and 6B into an electrical signal in electrical communication channel 10, the electrical signal includes separate information representing the intensity of light received from each of the optical communication channels 6A and 6B (and thus from each of the monitored areas A and B). A signal processor 12 receives the output electrical signal from converter 8 and processes it to obtain information, such as, for example, whether corona, arcing, flame ignition combustion, or smoldering conditions exist at any of the areas being monitored, the location of such conditions, the severity of such conditions, and the nature of materials involved in such conditions, and provides an output 14 representing such information. Output 14 desirably includes a visual display. Thus, the system of the present invention includes means for separately acquiring and processing optical radiation acquired from each of the monitored areas A and B to provide an output 14 separately indicating the nature of the optical activity in each monitored area.

Figure 2:
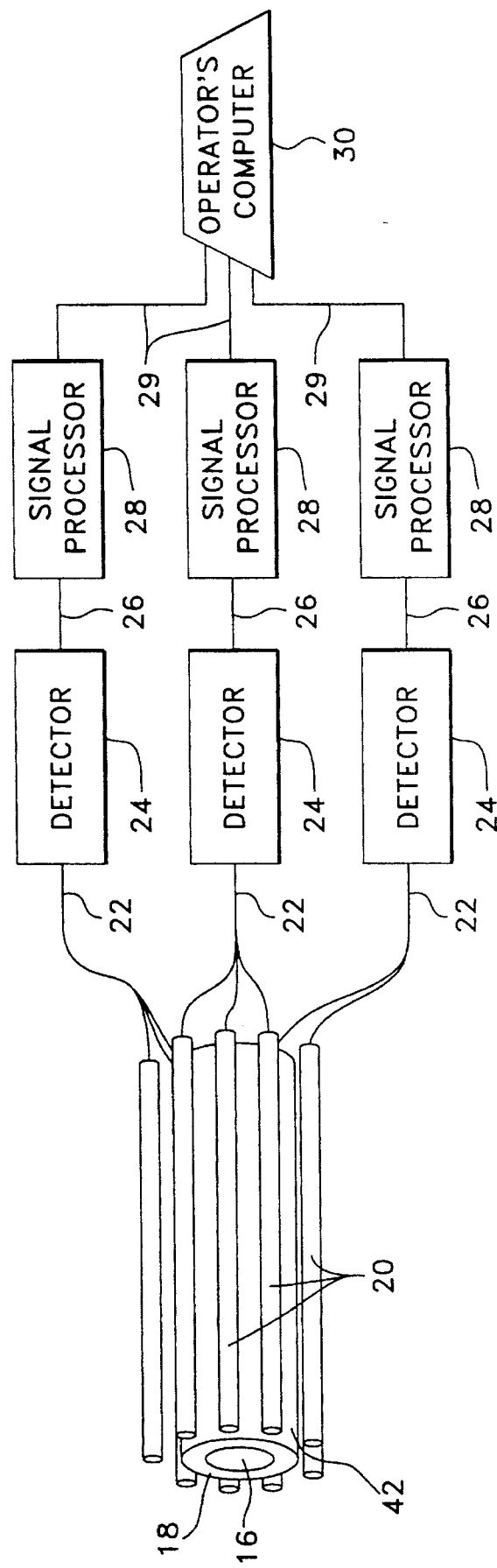
FIG. 2 is a further schematic diagram illustrating a system for monitoring the condition of a piece of electrical equipment in accordance with a preferred embodiment of the present invention.

Referring now to FIG. 2, there is shown a further schematic diagram illustrating a system for monitoring the condition of a piece of electrical equipment in accordance with a preferred embodiment of the present invention. In the preferred embodiment of the present invention, a plurality of optical acquisition devices (each of which has a different field of view) are used to form an optical probe 20. Thus, the optical acquisition devices in a probe 20 are disposed along a plurality of locations so as to receive light from a plurality of areas in the monitored equipment. In order to further increase the number of areas on the equipment being monitored, a plurality of optical probes 20 are preferably disposed in an array around the equipment. The fibers for an optical acquisition device in a probe 20 thus function both as sensors or light acquisition devices, which separately acquire light from different monitored areas, and as optical communication channels, which separately convey the light to a detector, thus preserving the spatial information regarding the location at which received light was emitted. Each optical acquisition device may be formed by a single optical fiber or by a plurality of fibers in an optical cable which, for purposes of this invention, function effectively as a single fiber and may be referred to for convenience as a fiber.

Referring still to FIG. 2, the equipment monitoring system of the present invention comprises one or more probe devices 20, fiber optical cable assemblies 22, detector units 24, communication channels 26, initial signal processing devices 28, and an operator's signal processing device or computer 30. An exemplary generator to be monitored by the equipment monitoring system of the present invention includes a stator 18 and a rotor 16 which is rotatably disposed, by means not shown, within the stator 18. The insulation surrounding the windings of the stator 18, on the generally cylindrical surface 42, are subject to corona ionization and like problems. To monitor the condition of the windings and their insulation during operation of the generator, a plurality of probes 20 are disposed around the outside of stator 18 so as to receive optical radiation generated by the windings. Such probes 20 may be supported by and within a generator housing, not shown, in the space between the inner surface of the generator housing and the winding surface 42. Several preferred arrangements for supporting probes 20 within the generator housing are discussed below in connection with FIGS. 7–9. It should be noted that the rotor 16 could be similarly monitored by disposing probes 20 in the space (not shown) between the rotor 16 and stator 18, although such monitoring is more complicated due to the movement of the rotor. Since optical radiation detection requires a line-of-sight relationship between the probe and the monitored surface, a cylindrical array of probes 20 are required to cover the entire circumference of the stator 18. The fibers 34 (shown in FIG. 3) from a probe 20 exit the probe structure itself and continue (either directly or through connectors) in fiber optical cable assemblies or bundles 22 to a detector 24, to convey the optical radiation received at the probe ends 40 of the fibers 34 to a photoelectric converter within the detector 24. The electrical output of detector 24 is coupled by an electrical communication channel 26 to a signal processor 28.

The operator's computer 30 receives the processed signals from each signal processor 28 over communication channels 29, and provides an operator interface including a visual display and operator input, such as by a keyboard. It will be understood that the functions of the detector, signal processor, and operator's computer as described herein need not be performed by separate pieces of equipment; for instance, a single piece of equipment could include all detectors, signal processing, and operator interface. Thus, the signal processors 28 and operator's computer 30 of FIG. 2 correspond to the single signal processor block 12 shown in FIG. 1.

The number and arrangement of the components will depend in large part on the specifics of the measuring application and design choices in the equipment selected for the application. The position-sensitive photoelectric converter selected will be characterized by its number of detecting elements, their size and their spacing, and these factors determine the number of the selected optical fibers which it can separately detect and consequently the number of separate areas in the generator which it can monitor. A plurality of detectors, as shown in FIG. 2, may be required depending on the number of monitored locations in the system and the number of fibers which can be handled by each detector 24. If a plurality of detectors 24 is used, then it may be desirable as shown to utilize a separate signal processor 28 coupled to each detector 24 to process the signals therefrom.

In routing the optical fibers between the probes 20 and the detectors 24, in a given application, the terminal configurations are more or less predetermined; each of the fibers from a probe must be conveyed to one of the detectors, and a set of fibers from one or more probes must be provided to each detector, the set being chosen to efficiently and effectively use the photosensitive area of the detector. Various options exist in between the terminal ends for grouping and routing the fibers. As illustrated in FIG. 2, the fibers from a set of probes intended for a particular detector may be grouped near the generator and conveyed as a separate bundle 22 to the selected detector 24. Alternatively, all fibers could be grouped in a single bundle and conveyed to the detectors, and split into separate bundles 22 adjacent the detectors. In either event, the fibers are desirably run in a protective conduit between the generator and the detectors.

In order to provide position information regarding an event, the system must be able to correlate a detected optical signal with the location of a particular probe fiber which acquired the detected light. This may be accomplished by controlling the routing of the fibers between the probes and the detectors so that a fiber from a predetermined probe location is made to illuminate a particular detector area. Alternatively, and preferably, the fibers may be routed in a random or uncontrolled manner, and the correlation between probe location and detector location determined afterward by selectively illuminating single probe fibers and determining which detector locations respond. Data obtained in this process may be stored in a lookup table or the like and thereafter used during monitoring to associate detector outputs with equipment locations.

Figure 3:
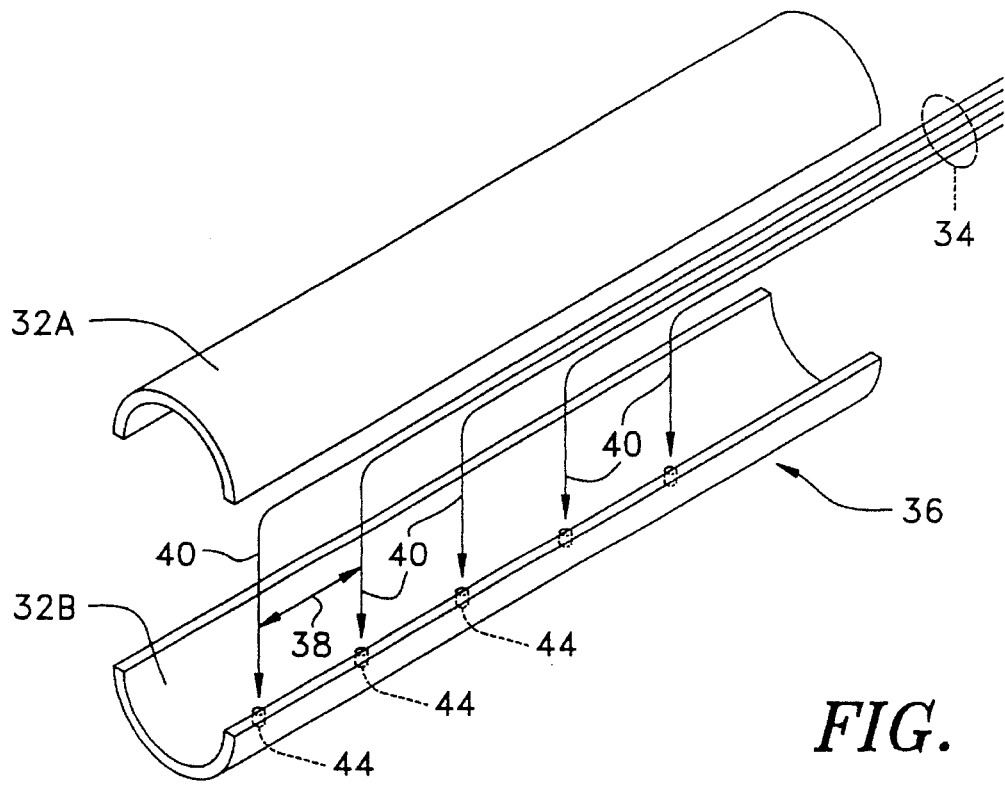
FIG. 3 is an exploded perspective view of a preferred optical probe for acquiring optical radiation from multiple areas on a piece of electrical equipment in accordance with a preferred embodiment of the present invention.

Referring now to FIG. 3, there is shown an exploded perspective view of a preferred optical probe 20 for acquiring optical radiation from multiple areas on a piece of electrical equipment in accordance with a preferred embodiment of the present invention. In the preferred embodiment, the light acquisition devices 34 in each elongated probe 20 collectively receive light from substantially the entire length of the stator 18, but from only a portion of the circumference of the stator 18. Probes 20 may be made with a simple and rugged structure which is conveniently mounted in the available space between the generator housing and the stator 18. Each probe 20 includes a plurality of optical fibers 34 having fiber ends 40 which are directed toward the end winding surface 42 to receive light generated at the surface.

In a preferred embodiment of probe 20, a plurality of optical fibers 34 are disposed at predetermined positions in a support structure 32. Support structure 32 includes a length of tubing, which may be longitudinally sectioned for convenience in fabrication to provide an upper portion 32A and a lower portion 32B. The tubing is preferably made of a nonconductive material, and PVC is believed to be suitable. Optical fibers 34 are assembled in tubing 32 with the terminal ends 40 of the fibers at a longitudinal spacing 38. A terminal end 40 of each fiber is inserted into a preexisting radial hole 44 in the bottom half section 32B of the tubing 32, a plurality of such holes 44 being provided at a spacing 38 so as to establish the spacing of fiber ends 40 along the length of the probe. The top half section of the tubing 32A is then attached to the bottom half 32B. The tubular member 32 thus formed is then "potted" or filled with a nonconductive material to fill all voids between fibers and give the assembled probe structural integrity. So constructed, the detecting fibers 34 are incorporated into a unitary, self-contained, integral, sensor-containing structure such as is commonly referred to in instrumentation as a "probe", as distinguished from an assemblage of mechanically separate components. Polyurethane and epoxy are believed to be suitable materials for filling the voids in the probe structure. The elongated cylindrical probe 20 so constructed may be made with a sufficiently small diameter as to easily fit within generators and the like and sufficiently rugged to survive in such a hostile environment. Such a probe 20 permits sensitive detecting equipment to be remotely mounted in a less hostile environment.

Referring still to FIG. 3, the fibers 34 are brought out of an exit end 36 of probe 20 which may be provided with probe-mounting or fiber conduit-interfacing structures as desired. Commercially available optical fiber cables are conveniently used in the probe structure. Such cables include a plurality of individual optical fibers which are enclosed within protective jacketing. A suitable optical fiber material is that supplied by Edmund Scientific Co. under its stock number D2536-37, which is a cable containing a strand of 16 plastic fibers in its jacket with a strand diameter of 1 mm. No doubt many other optical fibers are suitable. If attenuation losses over the generator-detector distance are substantial, glass fibers may be preferable. The 1 mm strand diameter of the referenced optical fiber material is believed suitable for use as a single "fiber" 34, both in terms of the light collection area of the strand end and the ruggedness and ease of handling it provides. Such a fiber material may be brought in its jacket to or through a hole 44. If a multiple-fiber cable is to monitor plural areas—for instance, if each fiber from a 16-fiber strand is to monitor one of 16 separate areas—then each of the fibers 34 of the strand must be separated from the bundle in order to be disposed within a separate radial hole 44. In that arrangement, a jacketed portion of the cable may extend partially within the probe at the exit end 36 so as to be surrounded by potting material and provide a rugged connection between the cable and the probe.

Figure 4:
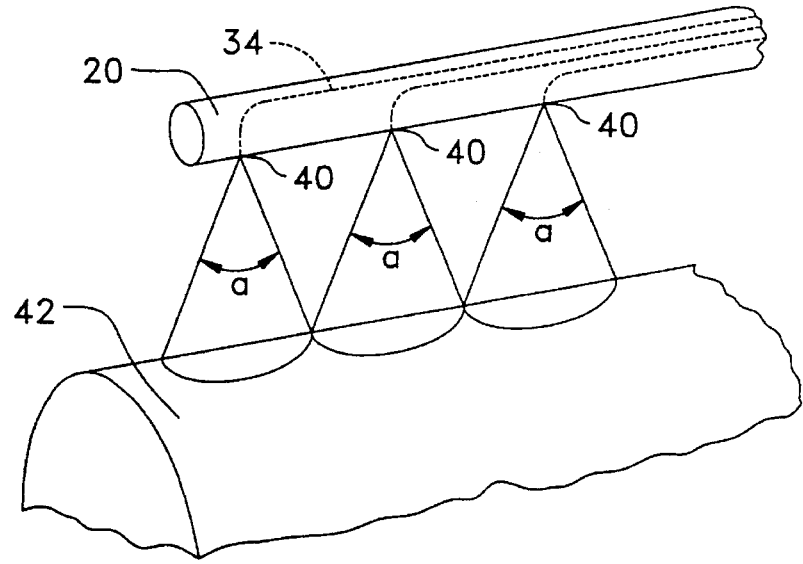
FIG. 4 is a schematic diagram illustrating the light acceptance cones of a preferred optical probe for acquiring optical radiation from multiple areas on a piece of electrical equipment in accordance with a preferred embodiment of the present invention.

Referring now to FIG. 4, there is shown a schematic diagram illustrating the light acceptance cones of a preferred optical probe 20 for acquiring optical radiation from multiple areas on a surface 42 of a piece of electrical equipment in accordance with a preferred embodiment of the present invention. Each fiber end 40 defines an aperture through which optical radiation may be admitted into a fiber 34. Each fiber 34 has a given ability to collect, and to convey through its length, photons that have optical paths that lie completely in a cone which has its apex at the fiber tip 40 and its base at the generator end winding surface 42. This cone is referred to as the acceptance cone of the fiber, and the angle of the acceptance cone is referred to as the acceptance angle. The acceptance angle of the particular fibers referred to above is 60 degrees.

The acceptance cone angle "a" and the separation between the fiber end 40 and the monitored surface of the generator end windings 42 determine the area covered by each fiber 34, i.e. the area on the surface 42 from which it collects photons. It is generally desirable to cover substantially the entire area of the monitored surface. For a given acceptance angle, surface area to be monitored, and probe separation from the monitored surface, the separation between fiber ends and the number of fibers required for substantially complete coverage is determined. The fiber ends 40 will normally be flat surfaces, but in order to modify the acceptance cone angle they may be terminated with a curved surface or provided with auxiliary optics. In the preferred arrangement of the invention, the end 40 of each fiber 34 is positioned at a distance 38 (shown in FIG. 3) from the end 40 of the adjacent fibers so that the base of each acceptance cone is generally tangent to the adjacent base. To minimize the number of fibers while obtaining substantially total coverage, the separation between the ends 40 of the fibers 34 and the generator end winding surface 42 is maximized to the extent permitted by the desired spatial resolution.

Figure 5:
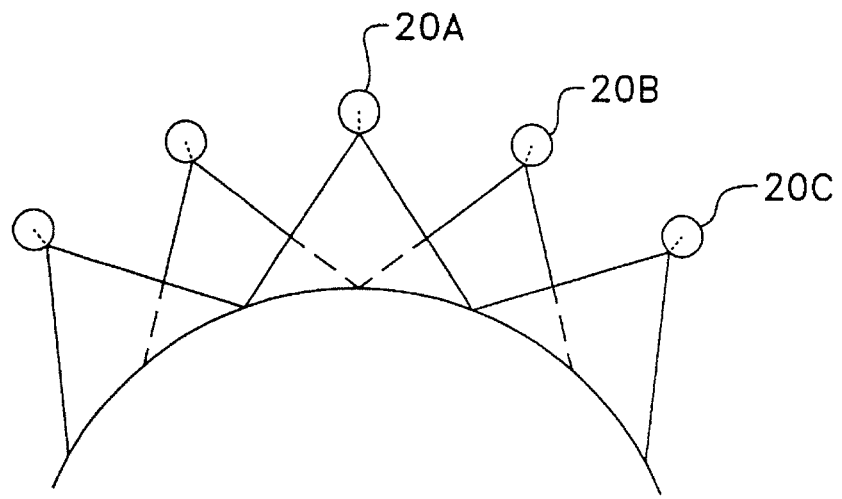
FIG. 5 is an axial diagram of a generator stator showing the acceptance cones of an array of optical probes for acquiring optical radiation from multiple areas on a piece of electrical equipment in accordance with a preferred embodiment of the present invention.
Figure 6:
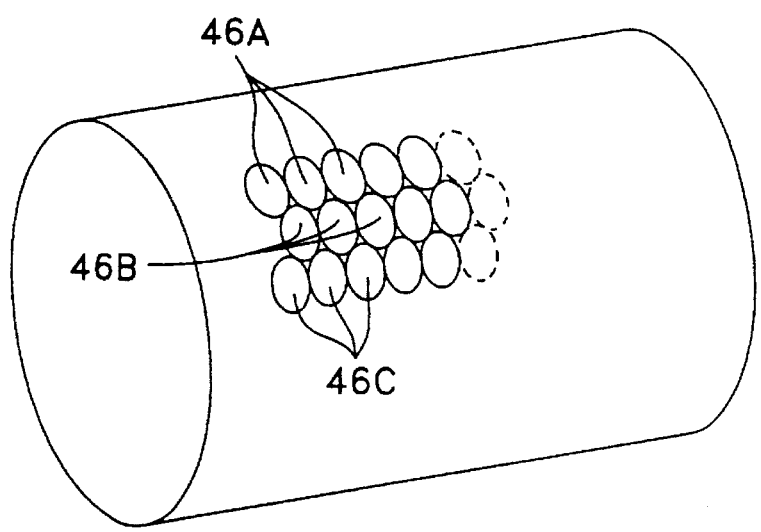
FIG. 6 is a perspective diagram of a generator stator showing the areas on the end windings thereof which lie within the acceptance cones of the probe array of FIG. 5.

Referring now to FIGS. 5 and 6, there are shown axial and perspective diagrams of a generator stator showing the acceptance cones of an array of optical probes 20 for acquiring optical radiation from multiple areas on a winding surface 42 of a piece of electrical equipment in accordance with a first preferred embodiment of the present invention. As shown in FIGS. 5 and 6, the probe devices 20A, 20B, 20C . . . , preferably are placed inside a generator housing in such a way that the bases of the acceptance cones of one probe device (e.g. 46B) interlock with the bases of the acceptance cones of the adjacent parallel probes (e.g. 46A and 46C). This provides a pattern of acceptance cone bases in the nature of a hexagonal close packing and provides substantially complete coverage without overlap.

Figure 7:
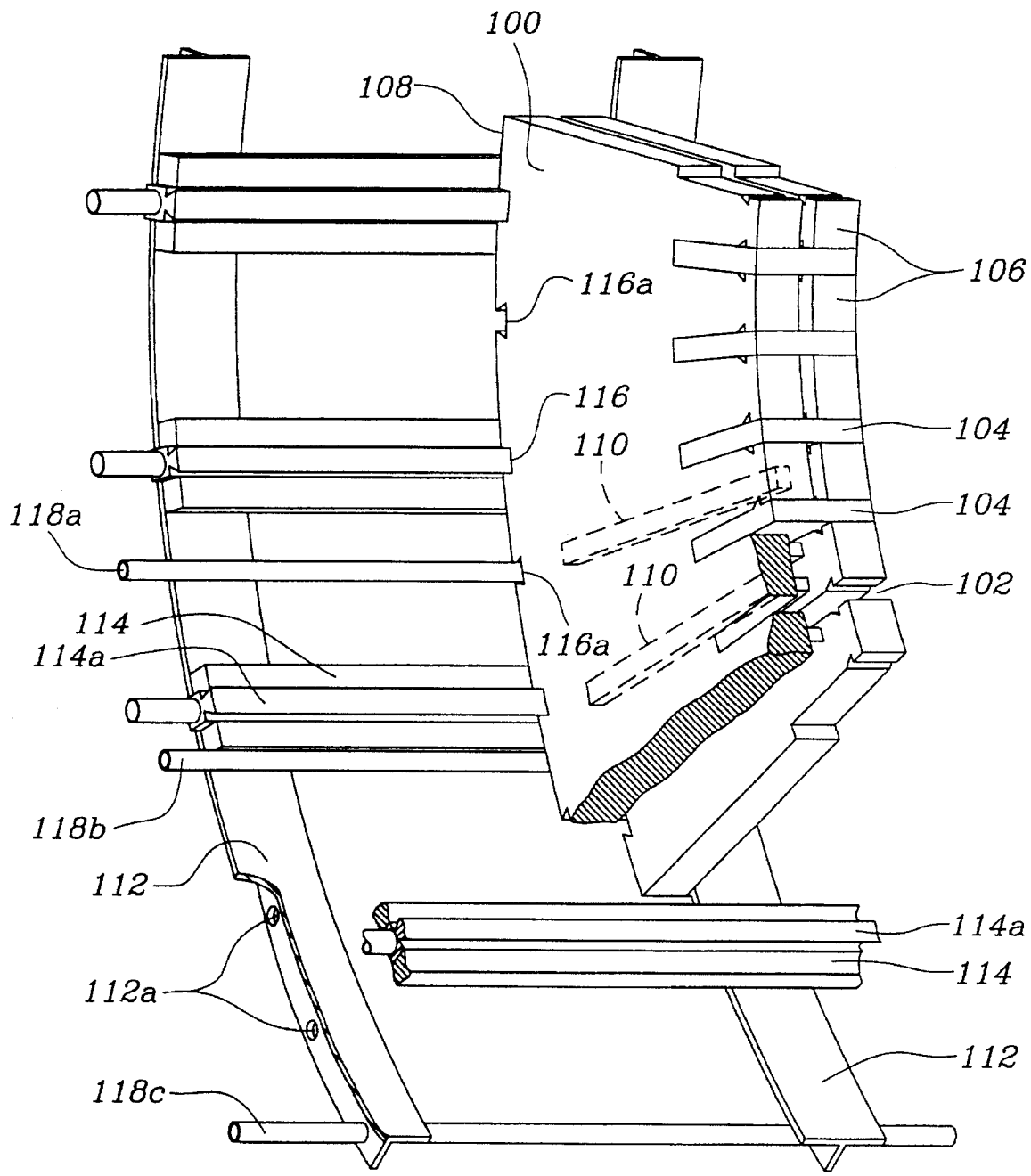
FIG. 7 is a cut-away view of a stator core punching assembly illustrating the preferred locations for mounting an optical probe on a piece of electrical equipment in accordance with an alternative preferred embodiment of the present invention.

Referring now to FIG. 7, there is shown a cut-away view of a stator core punching assembly 100 illustrating three preferred locations for mounting an optical probe 20 on a piece of electrical equipment in accordance with the present invention. Stator core punching assembly 100 is formed of a plurality of winding slots 102. Each of the winding slots 102 is sized to receive and hold a generator winding 104. As explained more fully below, each generator winding is formed of one or more conductor wires surrounded by several layers of electrical insulation. The winding core slots 102 lie along the interior cylindrical surface 106 of stator core punching assembly 100. The stator core punching assembly 100 has an outer cylindrical surface 108 which is positioned opposite and outside of interior surface 106. Stator core punching assembly 100 has a plurality of hollow vent openings 110 that extend radially from outer surface 108 toward inner surface 106.

The stator core punching assembly 100 is affixed to a section frame (not shown) by section plates 112 and key bars 114. The key bars 114 are rigidly affixed to section plates 112 and run perpendicular to the section plates. Each key bar 114 includes a dove-tail joint 114a running along the length of the key bar. Each dove-tail joint 114a is sized so as to engage within one of the dove-tail grooves 116 in stator core punching assembly 100. Key bars 114 are spaced around stator core punching assembly 100 such that every other dove-tail groove 116 in stator core punching assembly 100 is coupled with a corresponding dove-tail joint 114a from a key bar. For purposes of the present invention, each dove-tail groove in stator assembly 100 that is not occupied by a dove-tail joint 114a will be referred to as a "vacant" dove-tail groove 116a.

Figure 8:
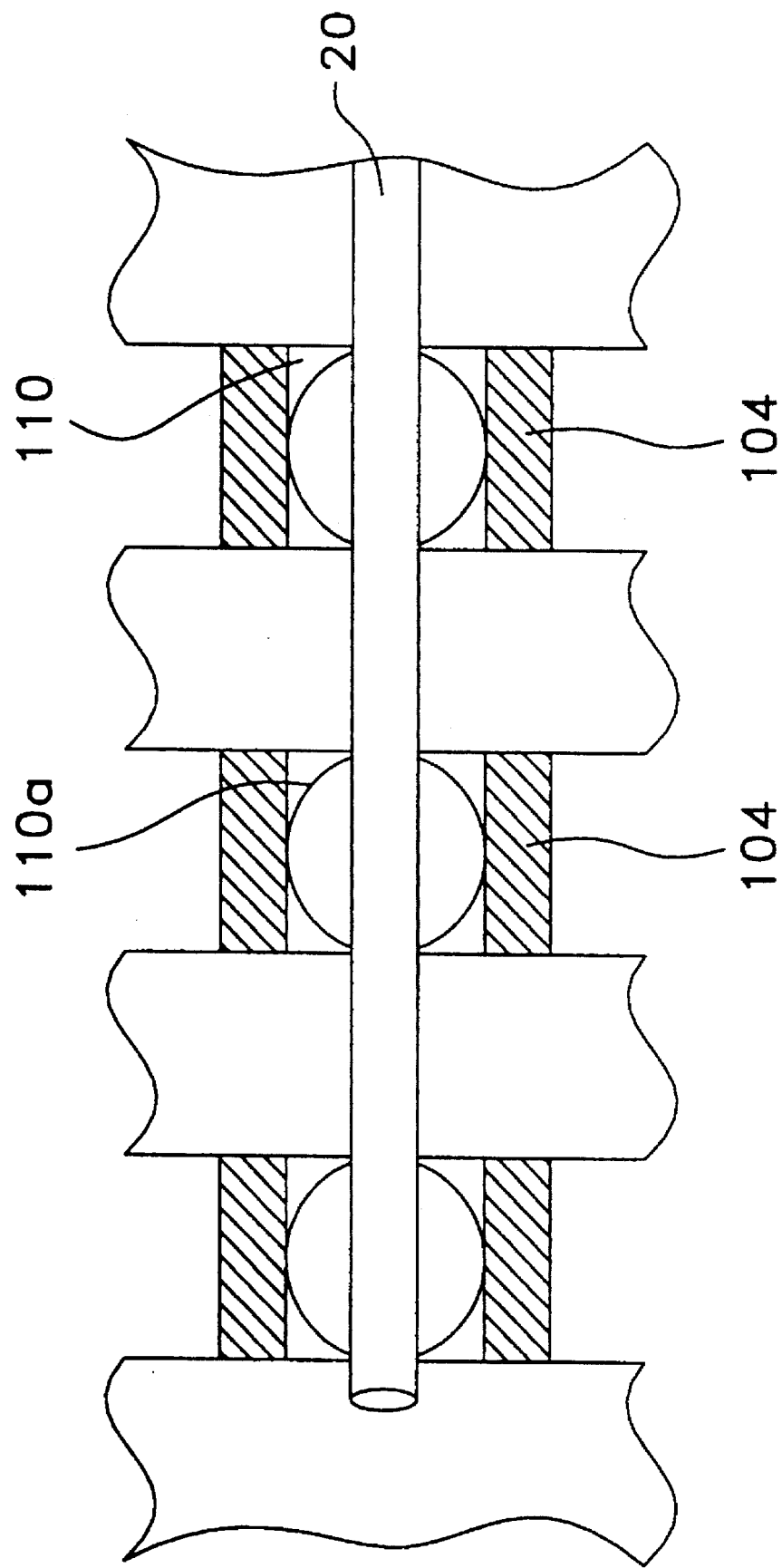
FIG. 8 is a top view looking through a vacant dove-tail groove and into a vent hole opening of the stator core punching assembly of FIG. 7, and showing a field of view of an exemplary optical acquisition device of an optical probe in accordance with an alternative preferred embodiment of the present invention.

Each hollow vent opening 110 extends from a dove-tail groove 114, 114a toward the interior surface 106 of stator core punching assembly 100. Referring now to FIG. 8, there is shown a top view looking downwardly through a vacant dove-tail groove 116a and into a hollow vent hole opening 110 of stator core punching assembly 100. In accordance with a preferred embodiment, an optical fiber 34 from a probe 20 is positioned at or near a vacant dove-tail joint 116a with its termination end 40 aimed downwardly into the hollow vent hole opening 110 such that the bottom-most portion of the acceptance cone of the fiber 34 is defined by circle 110a. Since corona emissions or other optical radiation emitted from a winding 104 will typically fall between winding slots 102, an optical fiber end 40 properly positioned adjacent a dove-tail groove 116a and aligned to look downwardly through a vent hole opening 110 will have a field of view sufficient to acquire and collect such optical emissions.

Referring again to FIG. 7, there are shown three alternative arrangements for mounting a probe 20 so that its optical fiber ends 40 lie adjacent to and may be aligned to look downwardly through vent hole openings 110. In the first arrangement (shown in connection with probe 118a), probe 118a is mounted within a vacant dove-tail groove 116a such that its optical fiber termination ends 40 face and are aligned with the vent hole openings connected to a vacant dove-tail groove 116a. In the second arrangement (shown in connection with probe 118b), probe 118b is mounted on and parallel to a key bar 114 such that its optical fiber termination ends 40 are facing and aligned with vent hole openings 110 adjacent to the probe. In the third arrangement (shown in connection with probe 118c), probe 118c is mounted on and perpendicular to section plates 112 by passing probe 118c through cooling holes 112a on the section plates. Again, in this third arrangement, probe 118c is mounted such that its optical fiber termination ends 40 are facing and aligned with vent hold openings 110 adjacent to the probe. Probes 118a, b, c are substantially identical to probe 20 described above.

Figure 9:
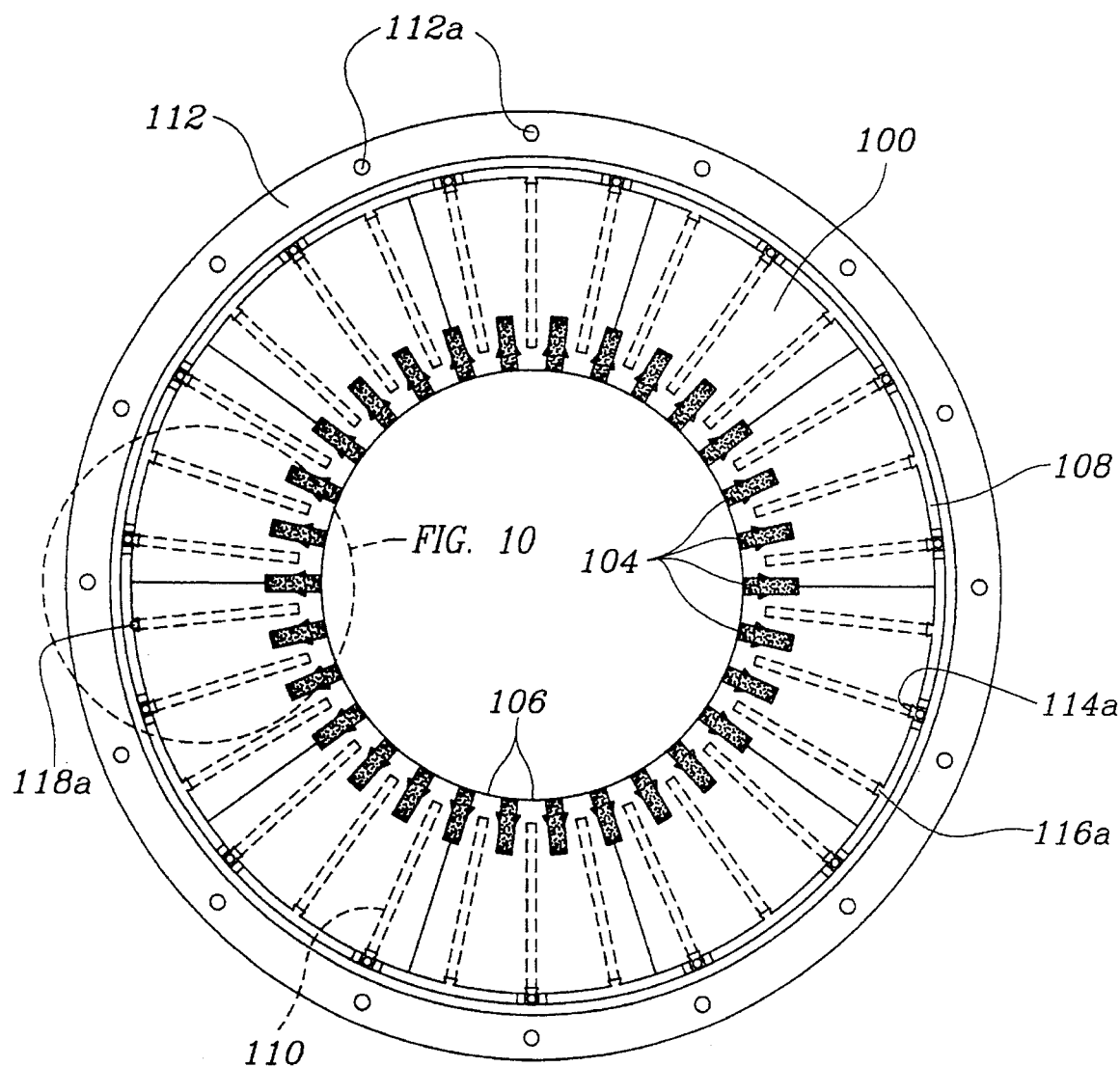
FIG. 9 is a cross-sectional view of an array of optical probes positioned around a generator stator assembly in accordance with an alternative preferred embodiment of the present invention.
Figure 10:
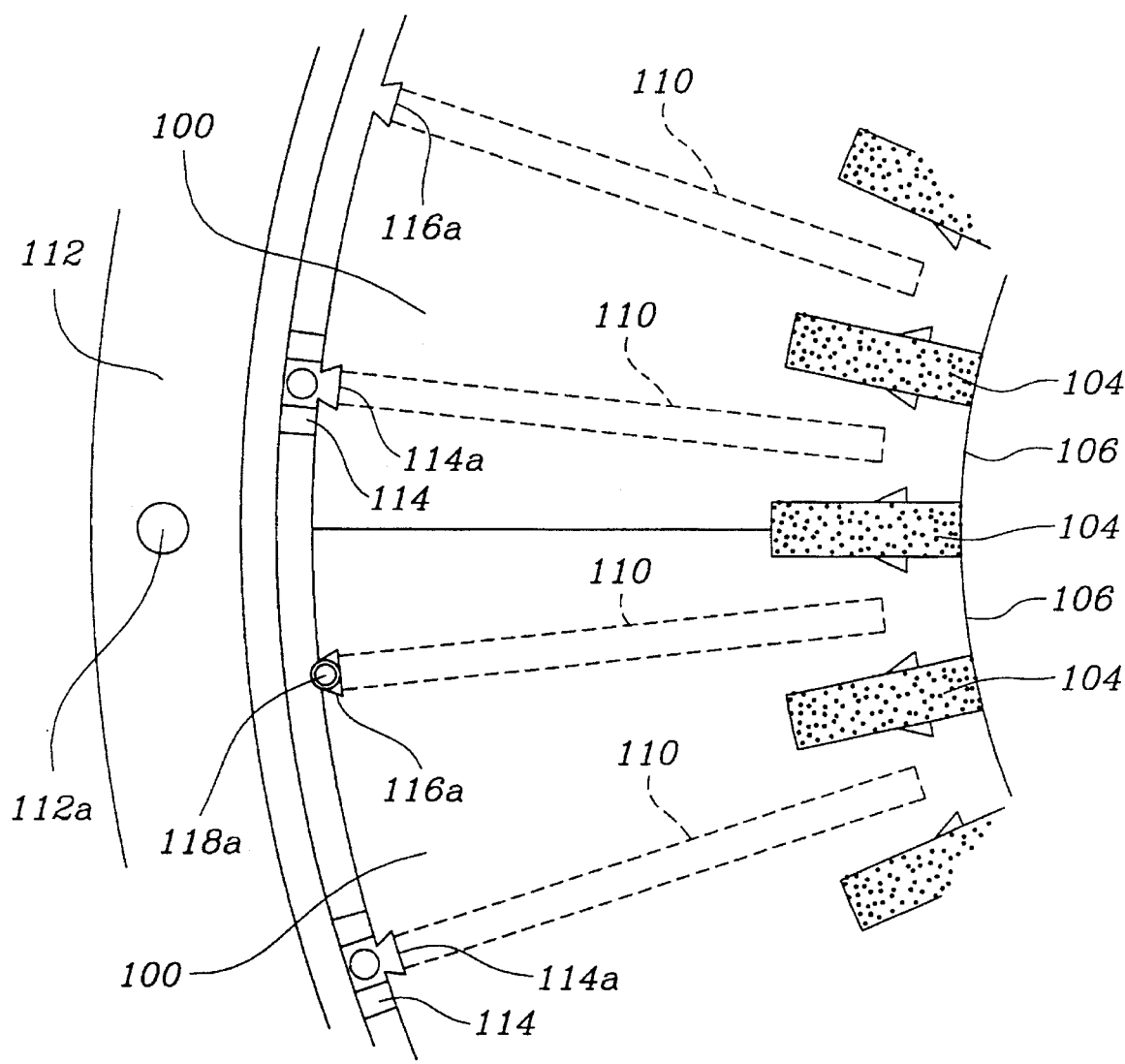
FIG. 10 is an expanded view of a portion of the probe array shown in FIG. 9.

Referring now to FIGS. 9 and 10, there are shown cross-sectional views of stator core punching assembly 100. FIGS. 9 and 10 illustrate how an array of optical probes 118a are preferably positioned around an electrical generator to fully monitor the generator for optical emissions including corona ionizations.

Figure 11:
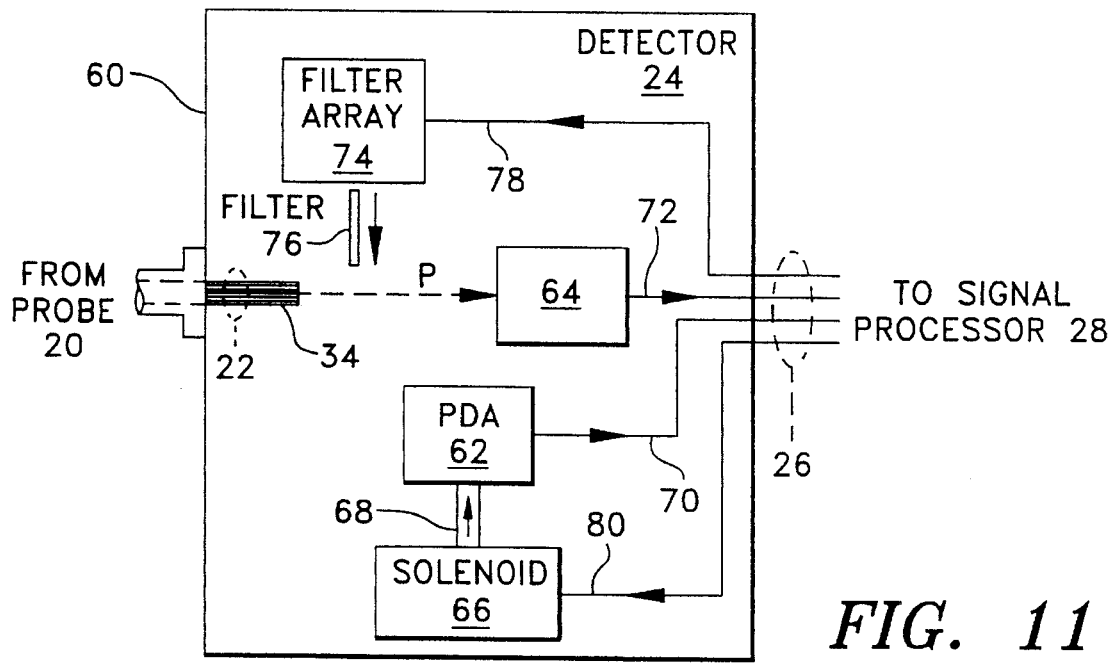
FIG. 11 is a schematic diagram of a preferred detector assembly for converting light acquired by optical acquisition devices of an optical probe to electrical signals in accordance with a preferred embodiment of the present invention.

Referring now to FIG. 11, there is shown a schematic diagram of a preferred detector assembly 24 for converting optical radiation acquired by optical acquisition devices 34 of an optical probe 20 to electrical signals in accordance with a preferred embodiment of the present invention. As shown in FIG. 11, a group or bundle 22 of fibers 34 from one or more probes 20 is brought through a wall of a detector housing 60 and terminated within the housing. The detector housing 60 is opaque to all photons that are detectable by the photoelectric converter(s) within it, e.g. ultraviolet and visible, in order to prevent detection of stray photons from other sources. Enclosed in the housing 60 is at least one position-sensitive photoelectric converter 64 which is disposed so as to receive light emitted from the terminal ends of optical fibers 34 and to generate an electrical signal responsive to the received light. The terminal ends of fibers 34 in housing 60 may be flat surfaces, but in order to modify or control the path of the emitted light they may be terminated with curved surfaces or provided with auxiliary optics.

The photoelectric converter 64 is position-sensitive in that it provides distinguishable output signals depending on the location on the converter at which it receives light. Accordingly, by directing the light emitted from different fibers 34 to different locations on the converter 64, signals are produced which include position information relating to the particular location within the generator from which the detected light was emitted. Thus, photoelectric converter 64 has a photocathode surface which is divided into a plurality of different sensing areas. As photons strike the photocathode surface, a separate output signal is generated by the photoelectric converter for each of the different sensing areas. Each such output signal represents the intensity of photons striking one of the different sensing areas on the photocathode surface Thus, photoelectric converter 64 is considered to be "position-sensitive" because it identifies not only the intensity of photons striking the photocathode surface, but also the position (or area) on the photocathode surface where the photon intensity was received.

The position information provided by photoelectric converter 64 is important to the overall invention. As explained more fully in the specification, in the present invention light is acquired separately from a plurality of different areas (on a piece of electrical equipment being monitored) by corresponding optical acquisition devices 34 (e.g., fiber optical strands). Each optical acquisition device 34 receives light from a field of view corresponding to a different one of the different areas on the electrical equipment being monitored. At converter 64, the ends of optical acquisition devices 34 representing several fields of view are grouped together and light from each of the grouped devices is simultaneously aimed at the photocathode surface of the converter 64. Based upon where photons from the optical devices 34 strike the photocathode surface of the detector 64, a determination is made as to which of the optical acquisition devices 34 provided the photons to the detector 64 and the area on the equipment being monitored (or field of view) from which the photons were emitted.

Desirably, the photoelectric converter 64 would have a spectral response and a dynamic range which would permit it to respond to light of the entire amplitude and wavelength range which may occur in a generator under corona, arcing, flame ignition combustion, and smoldering conditions. In practice, because of the limitations of existing photoelectric converters, a plurality of different converter types is used. In accordance with a further aspect of the invention, the detector 24 includes a converter 64 of a first type with first photoelectric response characteristics, a converter 62 of a second type with second photoelectric response characteristics, and means 66 for causing the light emitted from the optical fibers 34 to be selectively supplied to each converter. In a particularly preferred embodiment, the invention includes means for selectively supplying the light emitted by the optical fibers 34 to either the first or the second converter in accordance with predetermined characteristics of the light. Accordingly, the first converter 64 is preferably a position-sensitive photomultiplier tube, which is sensitive to low light levels such as may occur in corona conditions but is saturated and may be damaged by moderate light intensities. The preferred second converter 62 is a photodiode array, which lacks the sensitivity of a photomultiplier but is responsive to higher light intensities which may occur in arcing conditions and can withstand intense illumination without damage. The presently preferred means 66 for selectively supplying light to the converters upon predetermined conditions is a mechanical means for redirecting the light from one converter to the other in accordance with the light intensity as reflected in the electrical output signal of the active converter.

The present invention further includes means for determining the spectral characteristics of the light received by detector 24. While spectral information might be derived in detector 24 by directing the received light to a spectrometer, in the preferred embodiment as described herein the detector 24 includes optical filters having known spectral response characteristics which are interposed in the light path between fibers 34 and converters 62 and 64, and the electrical signals from the converters are processed by the signal processor 28 to derive the spectral characteristics of the received light. Use of a spectrometer as the spectral characteristic determining means has certain advantages, including speed of obtaining spectral information. However, it is believed that use of optical filters as the spectral characteristic determining means will generally be preferable because of the greater mechanical simplicity in interposing filters in the light path compared with directing the received light to a spectrometer.

Referring still to FIG. 11, the detector housing 60 encloses the detector components which preferably include a photodiode array (PDA) 62, a position sensitive photomultiplier (PMT) 64, and a solenoid 66 with a moveable shaft 68 coupled to the photodiode array 62. Photomultiplier 64 is mounted so as to receive along an optical path P the light which is emitted by the fibers 34 in bundle 22. While in a normal operating mode, as shown, the photodiode array 62 is in a neutral position not blocking the path P between the fibers and the photomultiplier 64, and light emanating from the fibers impinges on the photosensitive surface of photomultiplier 64 where its intensity and position are detected. To optimize the number of fibers in the group which can be handled by the detector, the distance along path P between the fiber termination point and the photocathode of the photomultiplier 64 should be minimized so that the light emanating from a fiber does not diverge over the path P sufficiently to illuminate multiple sensing areas. However, for this arrangement of the invention it is necessary to allow clearance for the insertion of the photodiode array 62 as well as for optical filters as described below. Depending on the spacing of the elements of the photocathode of photomultiplier 64 and the diameter of the fibers 34, the fibers may require separation to align them with the photocathode elements, and a means such as a perforated sheet for holding the fiber terminal ends at the required spacing may be provided in detector 24. It is believed that photomultipliers manufactured by Hammamatsu, Model No. R3292-06, and by Quantar Technologies Inc., Model No. 2601A, are suitable for use as photomultiplier 64.

The present invention includes means for monitoring the output signal level of photomultiplier 64 to control substitution of the photodiode array 62 as the active converter. Such means may be a dedicated circuit located in detector housing 60, or more preferably in signal processor 28. When it is determined by the monitoring means that the output of photomultiplier 64 exceeds a predetermined threshold, which may be set near its maximum output voltage and current, a signal is transmitted to solenoid 66 over solenoid control line 80 to actuate the solenoid. Actuation of solenoid 66 causes the solenoid shaft 68 and attached photodiode array 62 to be moved in the direction indicated by the arrow so that photodiode array 62 is inserted in path P between the terminal ends of fibers 34 and the photomultiplier 64, with the photosensitive surface of photodiode array 62 disposed to receive the light emanating from the fibers 34. This effects substitution of photodiode array 62 for photomultiplier 64 as the active photoelectric converter in the detector, and protects the photomultiplier from overexposure by occluding it. In a similar fashion, the output of the photodiode array 62 may be monitored when it is active, so that when its output falls below a predetermined threshold, a signal on control line 80 to solenoid 66 causes the photodiode array 62 to be withdrawn from the path P to allow photomultiplier 64 to become the active converter.

Other arrangements may be used to effect substitution of converters. One such arrangement is to provide two solenoids, one attached to the photodiode array 62 and the other attached to the photomultiplier 64. When it is active, the photomultiplier 64 is disposed closely adjacent to the ends of the fibers 34. When it is necessary or appropriate to use the photodiode array 62, by actuation of the solenoids, the photomultiplier 64 is moved away from the fiber bundle, allowing the photodiode array to be moved into the light-receiving position. This arrangement may cause damage to the photomultiplier due to the fast movement of the solenoid. Another alternative arrangement is to provide a solenoid attached to the fiber bundle. In this arrangement, the fiber bundle moves from the photomultiplier allowing the photodiode array to move into position by actuation of the solenoids. It is necessary in this arrangement to allow the fiber bundle to bend slightly but sufficiently to allow space for insertion of the photodiode array into the light path. In another alternative, the photomultiplier and the photodiode array may be maintained at fixed positions, with the fiber bundle 22 being moved to direct light to either one or the other. However, in some situations the selected fibers may not be sufficiently flexible to permit the necessary movement. The foregoing alternative arrangements have the advantage of minimizing the length of the path P since they do not require a fixed gap between the fiber ends and the multiplier to allow for insertion of the photodiode array. However, they have the disadvantage of increased mechanical complexity.

Also enclosed within detector housing 60 is an optical filter means for selectively interposing an optical filter(s) in the optical path P between the fiber bundle 22 and the active photoelectric converter. The preferred means shown in FIG. 10 includes a filter array 74 which contains a plurality of filters 76, each with known optical characteristics, which may be selectively interposed in the optical path P. As described below, this enables determination of the spectral characteristics of the received light. A signal on filter array control line 78 causes a selected one of the filters 76 to be moved from its inactive or storage position in the filter array 74 into the path P, as indicated by the arrow adjacent the illustrated filter 76. When photoelectric conversion and signal processing using the selected filter have been completed, a signal on control line 78 returns the selected filter to its storage position in array 74. This process may be repeated for each filter in a selected set of the filters contained in array 74, to enable the desired spectral analysis to be performed. It is believed that a carousel slide projector mechanism may be enlarged for use as the filter means, with a plurality of filters 76 stored in the carousel in place of photographic slides.

Figure 12:
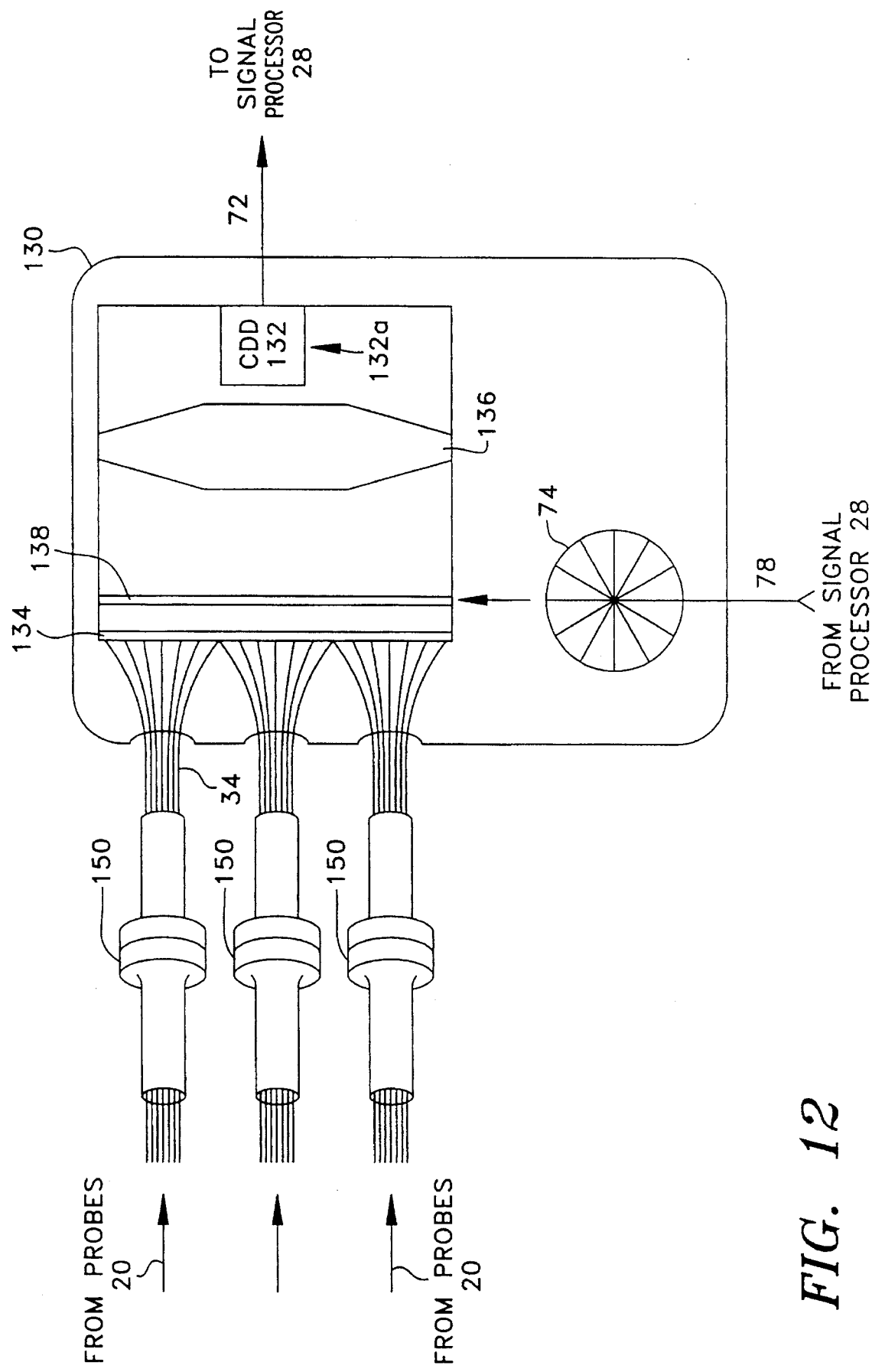
FIG. 12 is a schematic diagram of an alternative preferred detector assembly for convening light acquired by optical acquisition devices of an optical probe to electrical signals in accordance with an alternative preferred embodiment of the present invention.

Referring now to FIG. 12, there is shown a schematic diagram of an alternative preferred detector assembly 130 for converting light acquired by optical acquisition devices 34 of probe(s) 20 to electrical signals in accordance with an alternative preferred embodiment of the present invention. Detector 130 functions similarly to detector 24, with the exception of the following differences noted below. A single CCD array 132 is used in detector 130 as the position-sensitive photoelectric converter (as opposed to the photomultiplier tube 64 and photodiode array used in detector 24). In the preferred embodiment of detector 130, CCD 132 has a dynamic range which would permit it to respond to light of the entire amplitude and wavelength range which may occur in a generator under corona, arcing, flame ignition combustion and smoldering conditions. The InstaSpec™ IV CCD array manufactured by Oriel is suitable for use as CCD 132. CCD 132 is mounted inside detector 130 opposite a perforated tube sheet 134 which is used to align the termination ends 40 (not shown) of fibers 34 into a square grid as the fibers enter detector 130. Due to the small size of the face 132a of CCD 132 as compared to the size of tube sheet 134, it is necessary to reduce the composite image of the tube sheet 134 so that it will fit on face 132a. This is accomplished by using a converging lens assembly 136 in between tube sheet 134 and face 132a. As with detector 24, a plurality of filters (from a carousel 74) may be selectively interposed in the optical path between the fibers 34 and CCD 132. In detector 130, a filter slot 138 is provided for holding an individual selected filter 76 from carousel 74 during use of the selected filter by detector 130.

Figure 13:
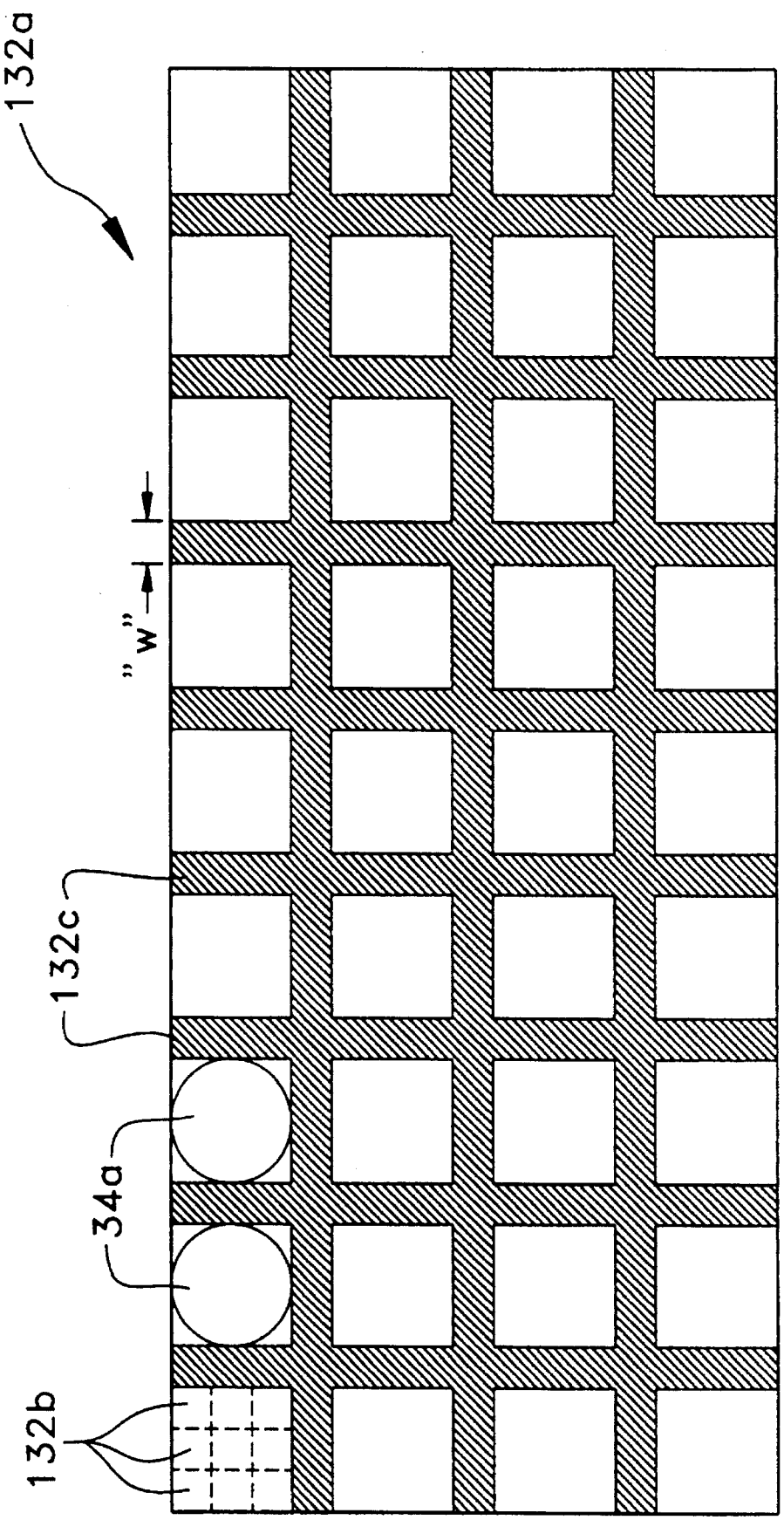
FIG. 13 is a front view of a preferred pixel masking layout for isolating on separate areas of a CCD array different optical signals transmitted from the optical fiber termination ends entering the detector assembly of FIG. 12.
Figure 14:
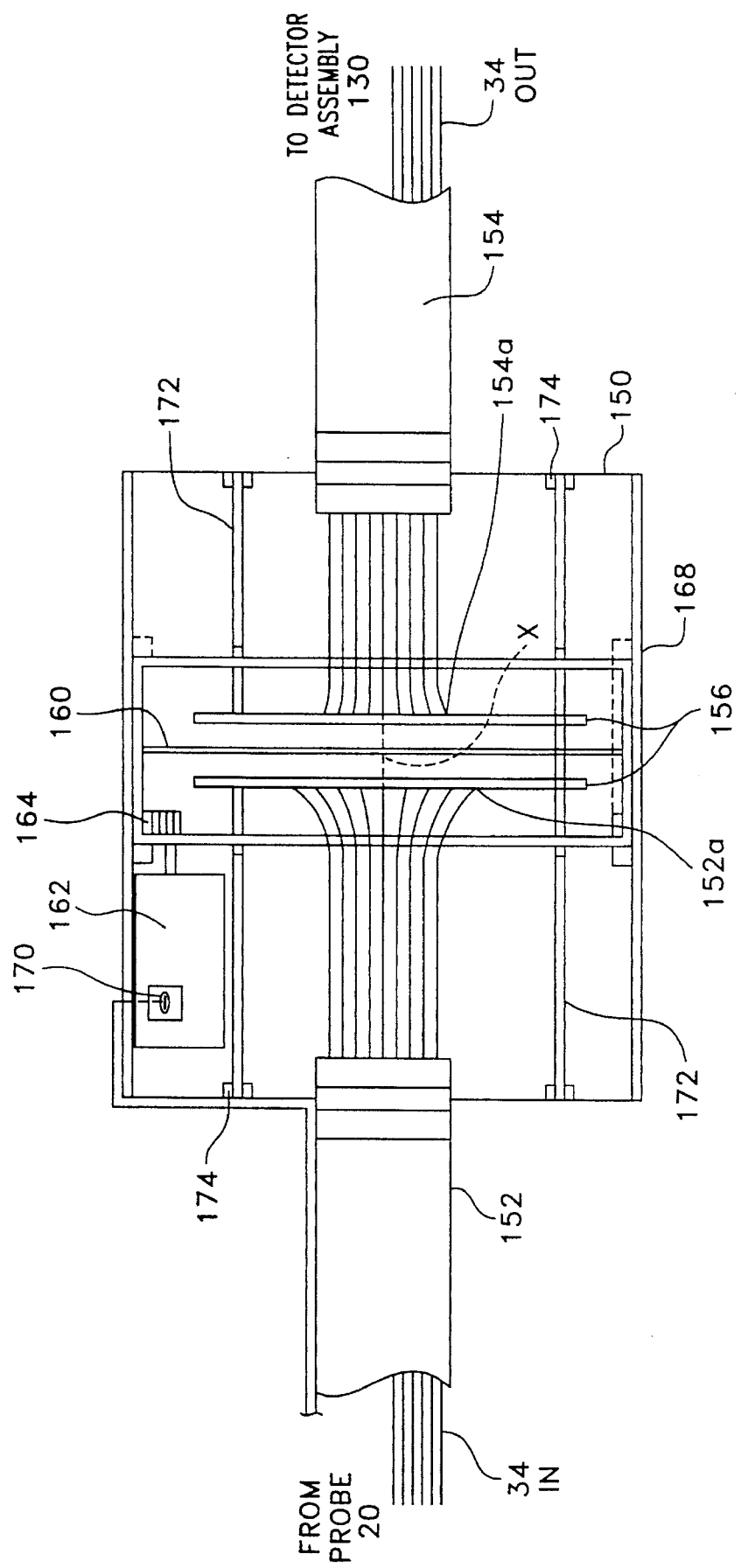
FIG. 14 is a cross-sectional view of an optical switch for selectively blocking optical signals acquired by an optical probe from entering the detector assembly of FIG. 12 in accordance with a preferred embodiment of the present invention.
Figure 15:
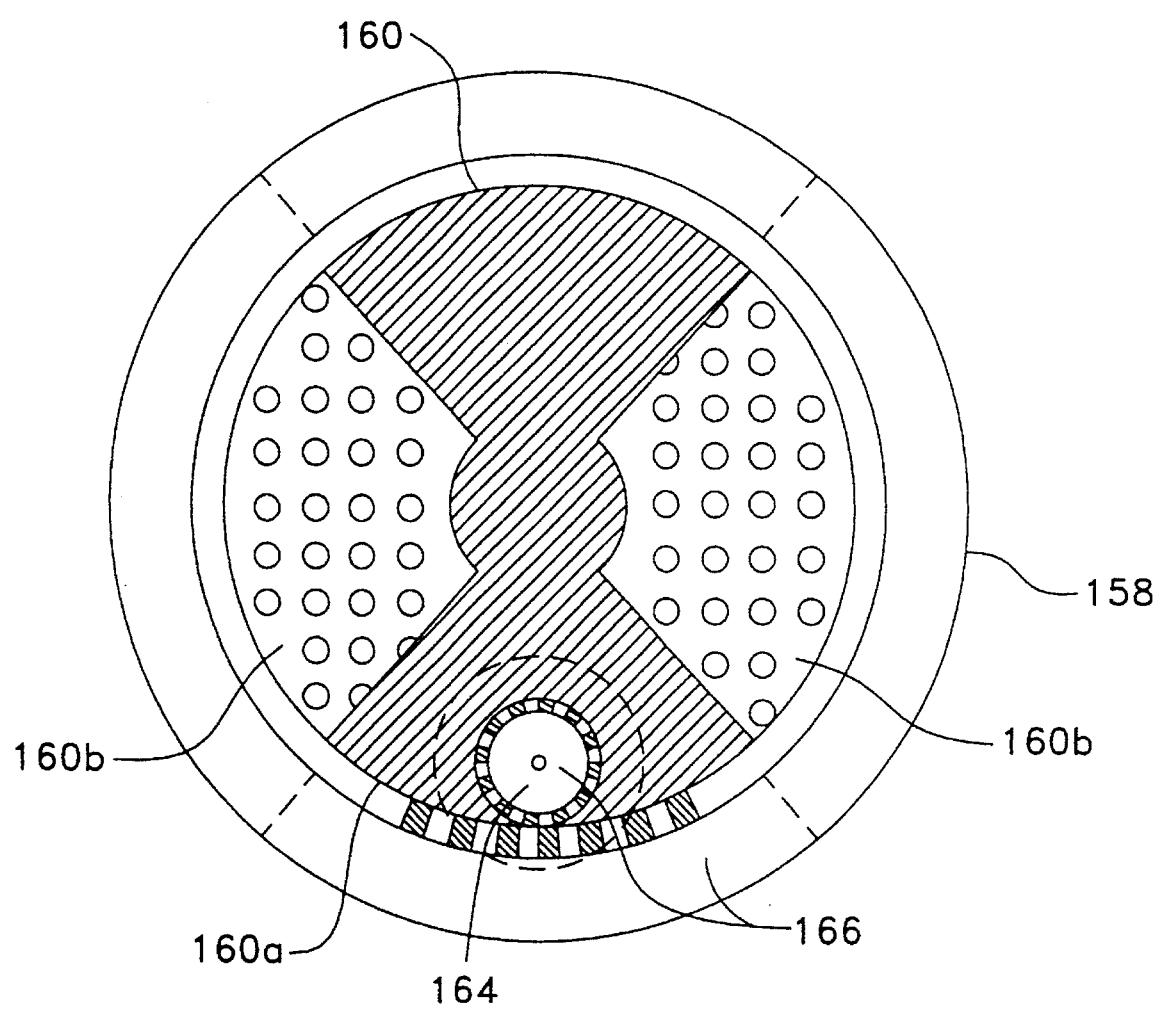
FIG. 15 is a cross-sectional view of the optical switch of FIG. 14 showing the optical switch in its open position.
Figure 16:
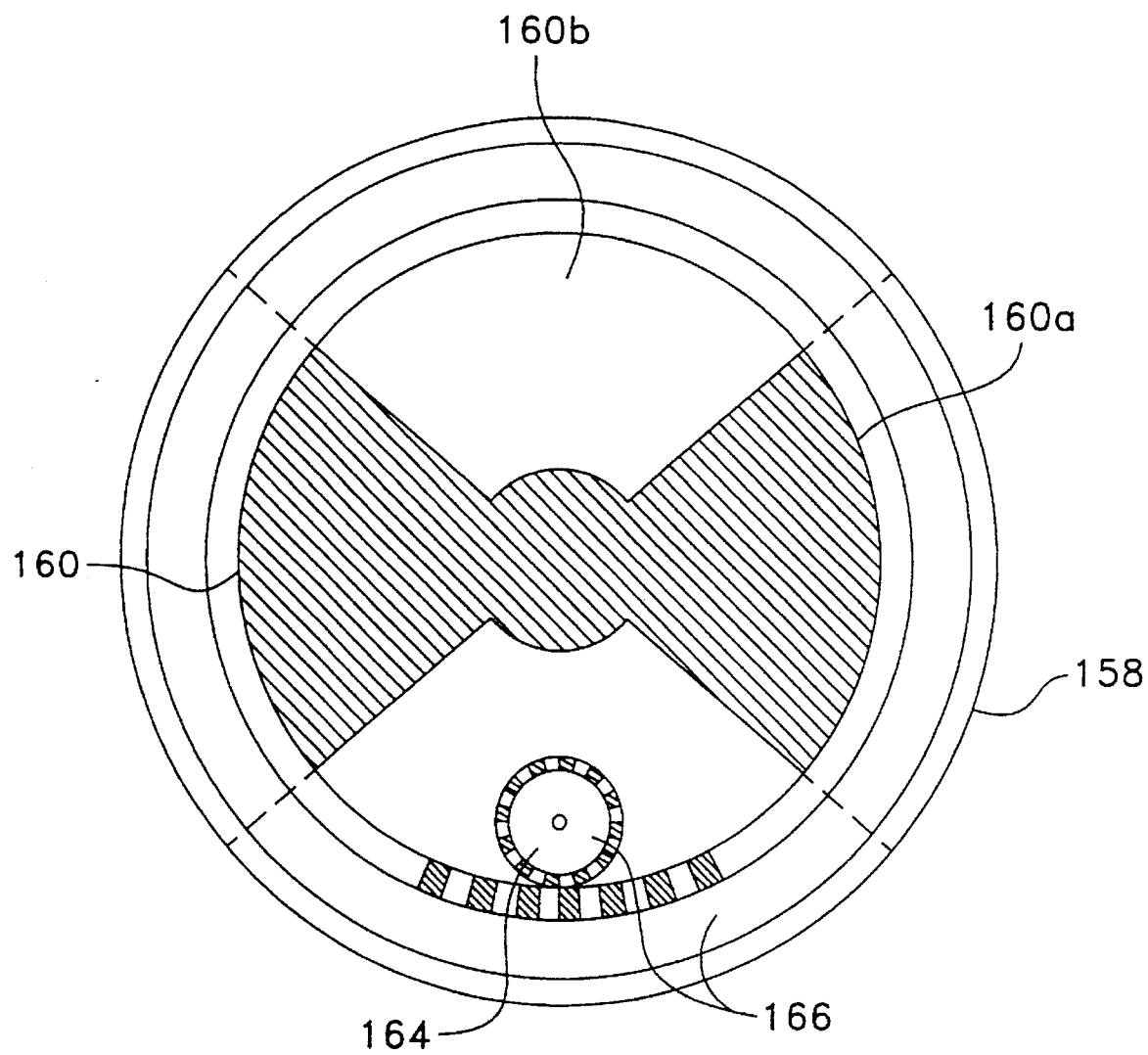
FIG. 16 is a cross-sectional view of the optical switch of FIG. 14 showing the optical switch in a partially-closed position.
Figure 17:
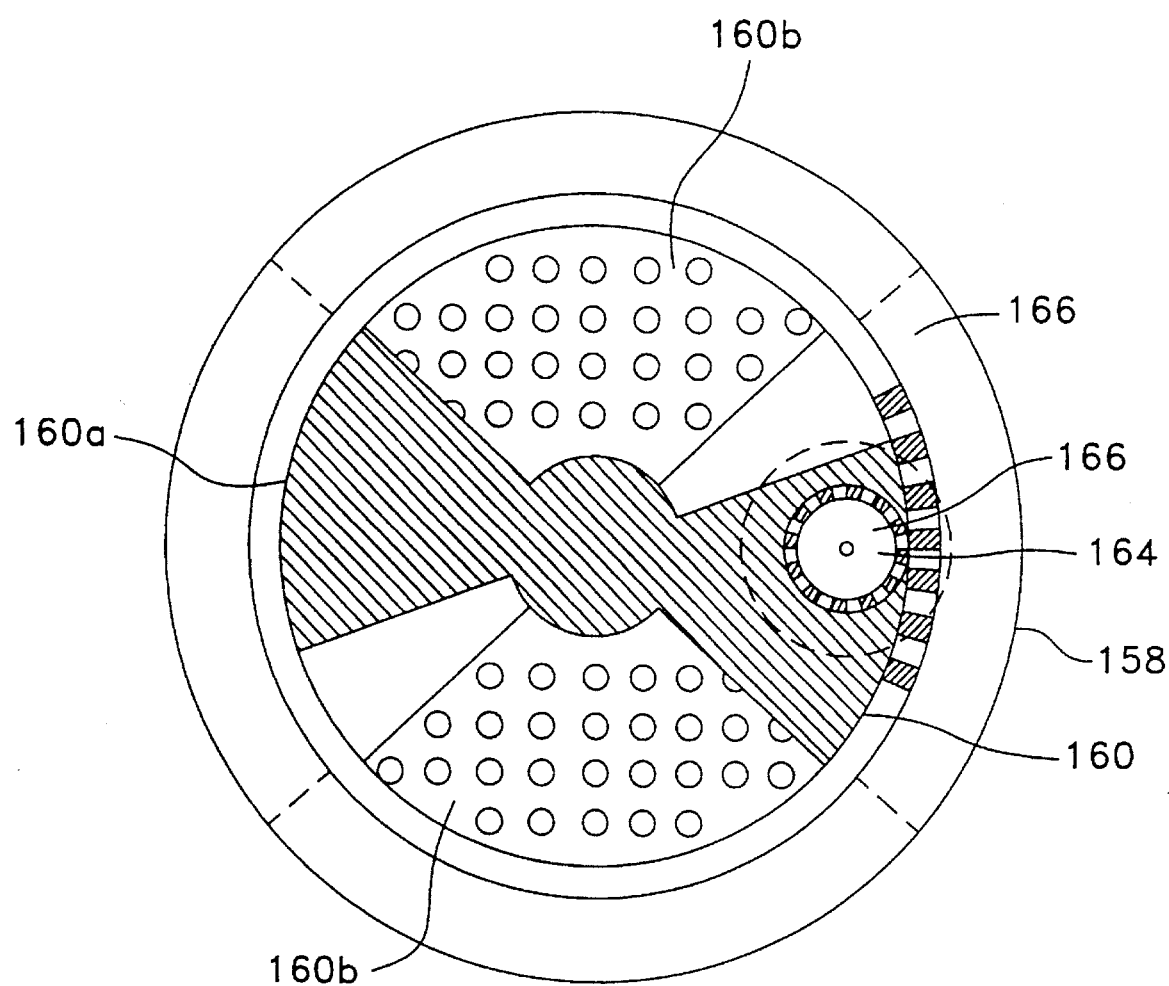
FIG. 17 is a cross-sectional view of the optical switch of FIG. 14 showing the optical switch in its fully-closed position.

Referring now to FIG. 13, there is shown a front view of a preferred pixel masking layout for isolating on separate areas of CCD face 132a different optical signals from the fibers 34 entering detector 130. CCD face 132a is formed from a two-dimensional array of individual picture elements (pixels) 132b. In the preferred embodiment of detector 130, resolution is improved by allowing the "spot size" 34a generated by each optical fiber 34 on face 132a to cover more than one pixel 132b. The pixels corresponding to each spot 34a are then added (by signal processor 28) to obtain a signal representing the optical emissions from each associated fiber 34. In the preferred embodiment, a mask or border 132c is used to isolate the pixels corresponding to each fiber 34, and to prevent overlap of optical signals from multiple fibers 34 from occurring on face 132a. Thus, signal processor 28 preferably includes means for identifying or storing the position of each pixel falling within the border or mask 132c. Signal processor 28 then effectively zeros (or ignores) any amplitudes of pixels falling within mask 132c when summing the pixel values corresponding to each fiber 34. The width "w" of the border or mask 132c may be one or more pixels.

Referring now to FIGS. 14–17, there are shown various views of an optical switch 150 for selectively blocking optical signals acquired by fibers 34 associated with an optical probe 20 from entering detector assembly 130. Optical switch 150 may be used, for example, to isolate the outputs of various probes 20 coupled to detector 130. Optical switch 150 is formed of an input fiber termination port 152 for coupling a plurality of fiber end portions 152a of input fibers $34_{IN}$ to the input of switch 150. An output fiber termination port 154 is provided for coupling a corresponding plurality of end portions 154a of output fibers $34_{OUT}$ to the output of switch 150. The fiber termination ports 152 and 154 are mounted on support bars 172 which are secured in mounting slots 174 on the interior walls of switch 150. Each input fiber end portion 152a is preferably aligned optically across the interior region 156 of switch 150 with a corresponding output fiber end portion 154a. Interior region 156 thus represents an optical transition path region between ends 152a and 154a. Interior region 156 is bounded on one end by input fiber termination port 152, on a second end by output fiber termination port 154, and by an opaque outer enclosure 158. When there is nothing obstructing transmission, optical signals flow freely from ends 152a, through interior region 156, and to ends 154a.

Referring still to FIGS. 14–17, a moveable light blocking structure 160 formed from opaque regions 160a and translucent regions 160b is disposed within optical switch 150. Moveable light blocking structure 160 may be rotated about axis "x" (shown in FIG. 14) in order to selectively block optical signals from passing between ends 152a and 154a. Moveable light blocking structure 160 has an open position (shown in FIG. 15) wherein no optical signals passing from ends 152a to ends 154a are blocked by opaque regions 160a. By rotating moveable light blocking structure ¼ turn, the structure 160 is transformed from its open position to its fully-closed position (shown in FIG. 16). When structure 160 is in its fully-closed position, opaque regions 160a block all optical signals from passing between ends 152a and 154a. Moveable light blocking structure 160 can also be rotated to a partially-closed position (shown in FIG. 17), wherein a portion of the optical signals from ends 152a pass through regions 160b to corresponding ends 154, and the remaining optical signals from ends 152a are blocked by opaque regions 160a. In a preferred embodiment of optical switch 150 (shown in FIGS. 14–17), an electro-mechanical actuator 162 may be used to drive moveable structure 160 between its open and closed positions. Electro-mechanical actuator 162 is preferably coupled to a turning gear 164 in a planetary gear arrangement 166 in order to rotate the structure 160 about the "x" axis. The planetary gear arrangement 166 is placed in a rotational track 168 in the interior wall of the optical switch 150. The electro-mechanical actuator 162 has electrical terminal connections 170 at the enclosure of optical switch 150 which are optically isolated.

Figure 18:
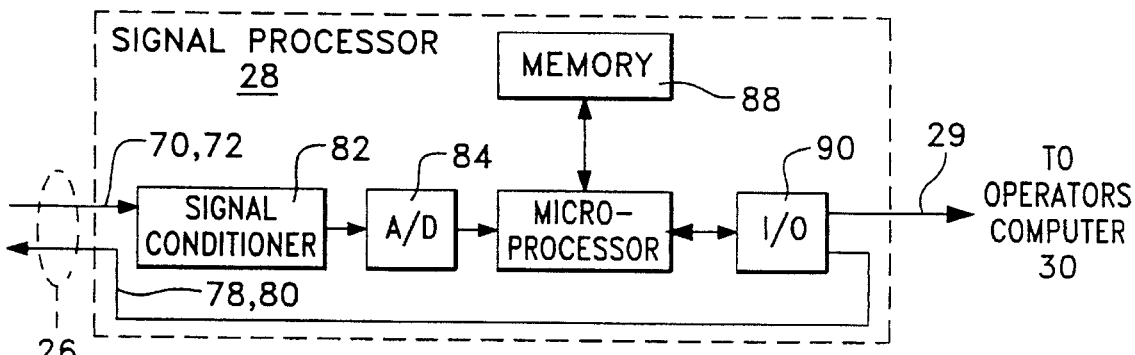
FIG. 18 is a block diagram of a signal processor for monitoring signals output by a detector and identifying the location of corona emission events occurring on a piece of electrical equipment being monitored in accordance with the preferred embodiment of the present invention.

Referring now to FIG. 18, there is shown a block diagram of a signal processor 28 for monitoring signals output by a detector and identifying the location of corona emission events occurring on an electrical generator being monitored. The output signals from a detector (either detector 24 or 130), which may be subjected to preliminary signal processing in the detector by means not shown, are conveyed to a signal processor 28 over signal lines 72 and 70 of communication channel 26. Signal processors 28 are desirably computer-based devices, and a block diagram of a suitable signal processor 28 is shown in FIG. 18. The light-responsive electrical output signals from a detector are typically initially subjected to signal conditioning, such as amplification, by a signal conditioner 82 after which the signals are digitized by an A/D converter 84 and input into microprocessor 86. It will be understood that when different converter types are used in the detector, as in the preferred embodiment described herein, signal conditioner 82 will generally require a different signal conditioning circuit for each detector type. Microprocessor 86 operates under control of a program stored in memory 88 to perform the functions described herein, and communicates with an operator's computer 30 via I/O device 90 over communication channel 29.

The amplitudes of the signals from the detector are monitored by signal processor 28 to determine the light intensity represented by the signals. When the signal amplitude is sufficient to indicate an event of interest in one or more fibers of the probes, which may be determined by comparison with a predetermined threshold value, data representing the occurrence of the event, including its nature, location, and magnitude, is transmitted to operator's computer 30. Such events may include corona, arcing, flame ignition combustion, and smoldering. The operator's computer preferably includes a visual display, and displays graphic and text information regarding the event. Data regarding all such events may be stored, either in memory 88 or in a memory contained in operator's computer 30. Data may be stored at periodic intervals to record the changes in the monitored condition over time.

Signal processor 28 may control the operation of the filter array 74 to allow the system to perform spectral analysis of the light signal under predetermined conditions, such as the occurrence of an event of interest. Thus, FIG. 18 shows I/O device 90 coupled to communication channel 26 for transmission of a filter array control signal to a detector over control line 78. (In a similar manner, signal processor 28 may control the operation of the solenoid 66 by transmitting a solenoid control signal over control line 80 to effect interchange of the converters.) Thus, upon occurrence of an event, data may be stored regarding the light intensity with no filter and the light intensity with each of the filters 76 selected from filter array 74. By comparison of the signal amplitudes obtained with different filters, and in view of the known transmission versus wavelength characteristics of the filters, amplitude versus wavelength information regarding the received light can be derived. This information may be used to evaluate the chemical composition of the materials involved in an event, which is useful for instance to determine the extent of damage to the monitored equipment. In order to evaluate the chemical composition of the materials involved in an event, a large number of narrow bandwidth filters may be used so that the spectrum can be determined with high resolution. However, because there are a limited number of materials which can be expected to be involved in an event, it may not be necessary to obtain a complete high resolution spectrum in order to provide the information desired in the monitoring of electrical equipment. In this environment, it is the materials typically found in the conductors, insulation, support structure, and atmosphere which are of concern. Thus, the number of filters may be minimized by providing narrow bandwidth filters selected to pass or block the spectral lines expected for materials used in these applications under the corona, smoldering, arcing, and flame ignition combustion conditions of interest. Because of their narrow bandwidth, interference filters are believed to be most preferable for spectral line identification. Such filters may be constructed with single or multiple pass or stop bands; if constructed for multiple bands, a single filter may be made to selectively filter several spectral bands occurring in events involving a particular material which is expected to be utilized in electrical equipment. For example, if copper is involved in the event it will indicate that conductive material has been exposed and maintenance is probably required. One or more filters designed to isolate spectral lines of copper under conditions of interest could determine copper involvement without necessitating a complete spectrum to be obtained and analyzed.

Figure 19:
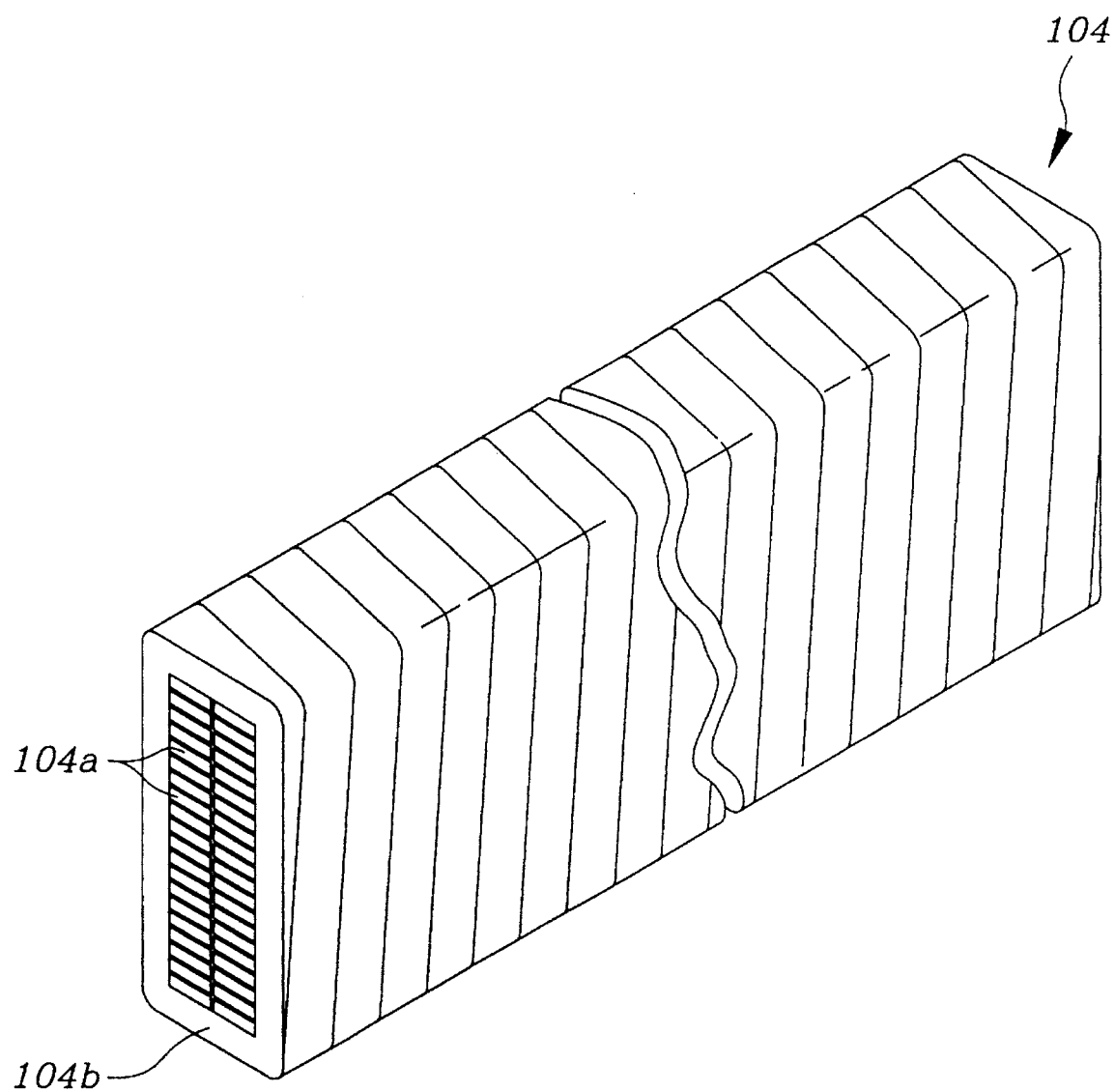
FIG. 19 is a perspective view of a portion of a generator winding surrounded by doped insulation in accordance with a preferred embodiment of the present invention.
Figure 20:
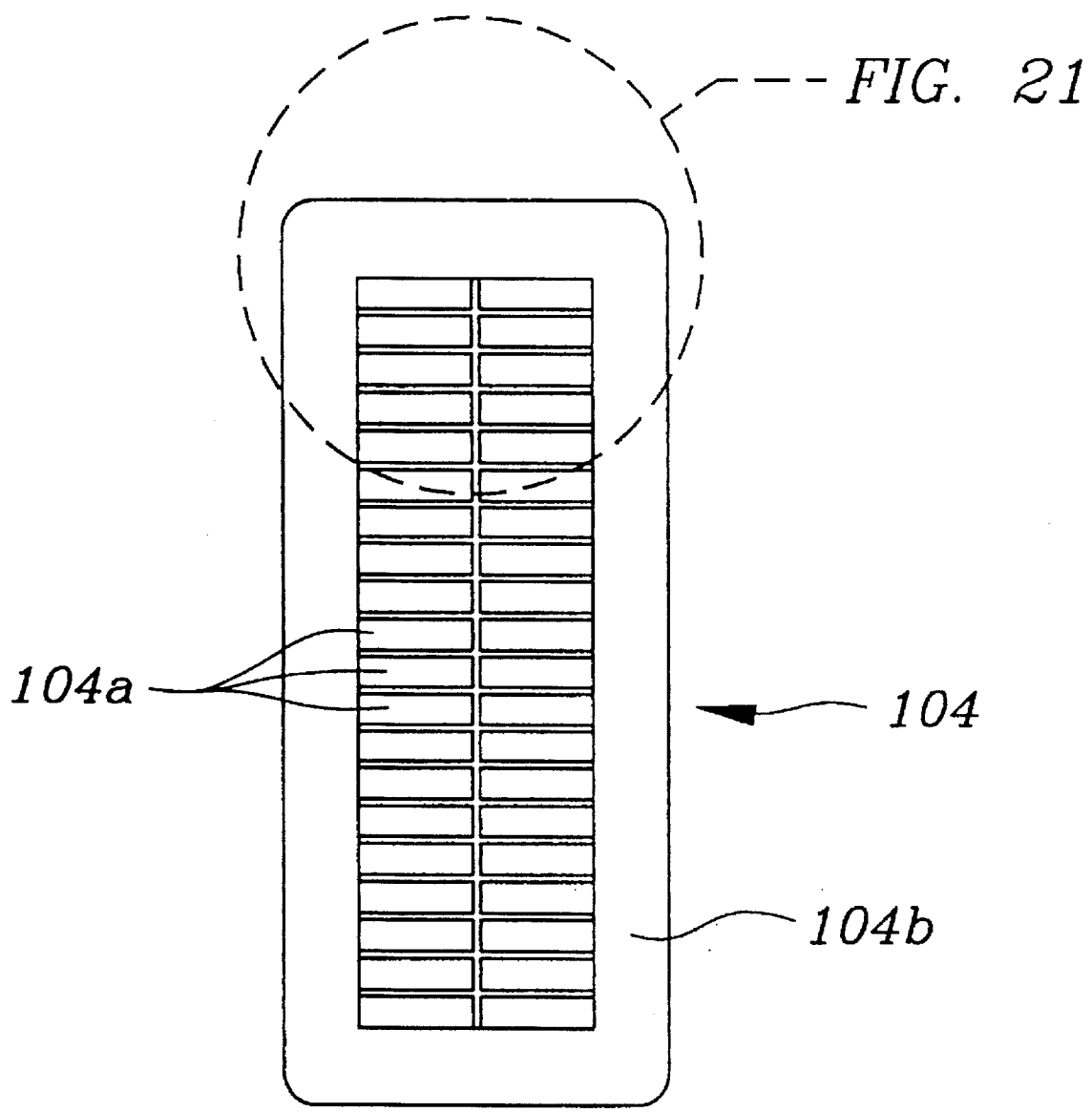
FIG. 20 is a cut-away view of the generator winding portion shown in FIG. 19.
Figure 21:
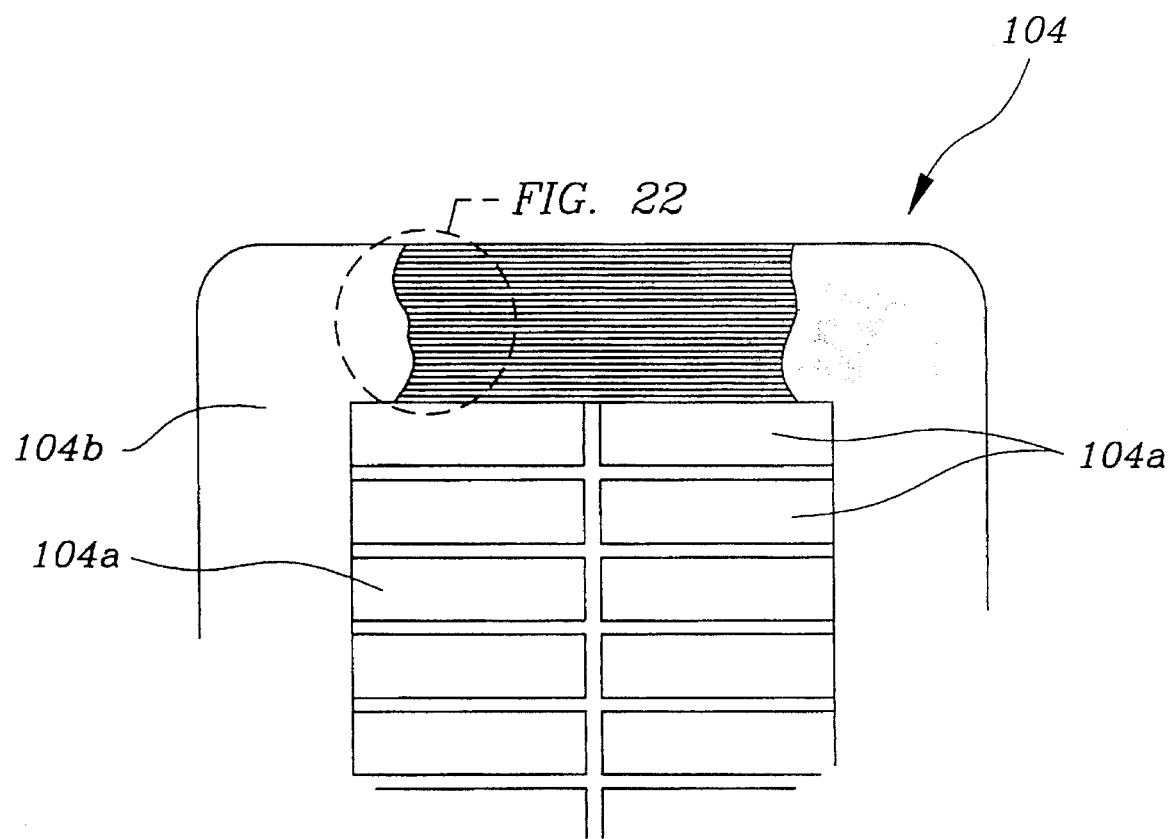
FIG. 21 is an exploded view showing sub-layers of the insulation layer illustrated in FIG. 20.
Figure 22:
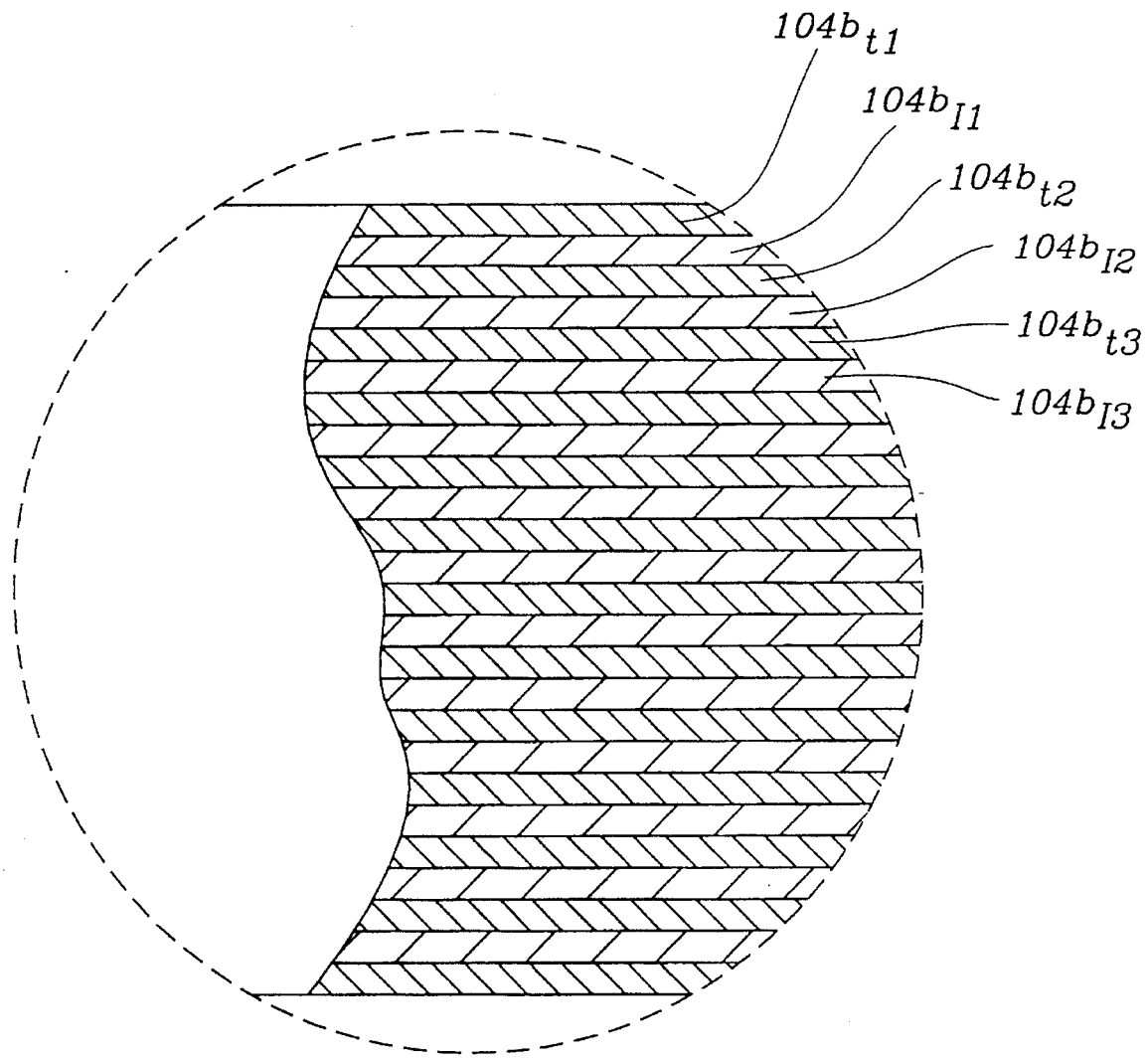
FIG. 22 is a further exploded view showing a portion of the various insulation sub-layers illustrated in FIG. 21.

In order to enhance the ability of detectors 24 and 130 to identify corona ionization emissions and the extent of insulation degradation that may have occurred around generator windings as a result of such corona ionizations, the layers of insulation surrounding a generator winding may be doped or treated with special materials that emit a distinctive optical signature upon ionization. This aspect of the present invention is shown in conjunction with FIGS. 19–22 which are discussed below. Referring now to FIGS. 19 and 20, there are shown perspective and cut-away views, respectively, of a portion of a generator winding 104. As explained more fully above, a generator winding 104 is disposed in winding slot 102 during operation of an electrical generator. Winding 104 is formed from a plurality of conductor wires 104a which run parallel to the length of winding 104. An insulation layer 104b surrounds the conductor wires 104a. In FIGS. 21 and 22, there are shown expanded views of insulation layer 104b. Thus, as shown, insulation layer 104b is formed of a series of alternating sub-layers of insulation tape ($104b_{t1}$, $104b_{t2}$, $104b_{t3}$ ...) and electrical insulation ($104b_{I1}$, $104b_{I2}$, $104b_{I3}$ ...). In accordance with the present invention, one or more of the sub-layers of insulation tape or insulation is initially doped or treated with a doping material which generates a distinctive (and predetermined) optical signature when corona ionization occurs on the sub-layer, thereby signifying its deterioration. This distinctive optical signature preferably corresponds to an isolatable narrow or specific optical wavelength which is easily detectable by the detectors and signal processing system 28 described above. The dopants or materials used to treat the sub-layers preferably should not affect the insulation qualities of the sub-layers, but should simply allow for specific optical emissions from such sub-layers upon corona ionization. Suitable dopants for treating the sub-layers in layer 104b include sodium carbonate, titanium dioxide, calcium carbonate and sodium silicate.

In accordance with a still further preferred embodiment of the present invention, each sub-layer or group of sub-layers forming insulation layer 104b may be treated with different dopants such that a series of different optical signatures will be emitted as the insulation degradation process proceeds over time. Thus, for example, sub-layers $104b_{f1}$, $104b_{f1}$ may be treated with a first dopant that emits a first predetermined optical signature upon ionization, sub-layers $104b_{f2}$, $104b_{f2}$ may be treated with a second dopant that emits a second predetermined optical signature upon ionization, and sub-layers $104b_{f3}$, $104b_{f3}$ may be treated with a third dopant that emits a third predetermined optical signature. As the deterioration of insulation layer 104b proceeds over time, different optical signatures will be emitted thereby signifying that deterioration has occurred at the sub-layers associated with such optical signatures. In the preferred embodiment, when multiple different dopants are used at various sub-layers in layer 104b, the detectors described above are used to detect the optical signatures associated with the multiple dopants, and to generate and transmit electrical signals representative of such optical signatures to signal processor 28 which then monitors such electrical signals in order to track the extent of deterioration within the various sub-layers of insulation layer 104b.

The method of spectral identification of particular insulation layers is not dependent upon the type of inner insulating tapes, outer insulating tapes, or protective coatings. The method is independent of the insulating materials. The chemical species used to dope or treat the insulation sub-layers is selected based upon certain conditions which allow for the selection of a particular element, compound, or group of compounds that are chemically compatible and desirable in an insulating system. The dopant or marker selected for use with the present invention preferably does not interact or overlap with the spectral emission lines of the insulating materials used in the insulation system. The number of markers is selected based upon the depth of the insulation region that is to be segregated, and the ability to identify chemical species that have non interfering spectral emission lines. The dielectric strength of the insulating system must not be comprised by adding a spectral marker that violates the integrity of the non-conducting properties of the material. Markers may be suspended into the tape prior to the impregnation process in which the stator-bar tape layers are chemically treated with the polymer or other plastic insulating material. The preferred method is to introduce the spectral markers into a solvent with the monomer compounds of the material before the monomers are polymerized. This is the preferred method of adding modifiers to polymers.

Changes and modifications to fit particular operating requirements and environments will be apparent to those skilled in the art. The invention is not to be considered limited to the examples chosen for the purpose of illustration and includes all changes and modifications which do not constitute a departure from the true spirit and scope of the invention.

What is claimed is:

1. An apparatus for monitoring the condition of an electrical generator having at least one conductor, comprising:

(A) an insulator surrounding said at least one conductor, said insulator having an interior surface adjacent to said at least one conductor and an exterior surface opposite said interior surface, said insulator having a depth spanning between said interior and exterior surfaces of said insulator, said insulator being formed of a plurality of overlapping layers positioned along said depth, each of said plurality of layers including an associated one of a plurality of different light producing materials, wherein each of said plurality of layers generates one of a plurality of different distinctive optical signatures upon degradation;

(B) an optical acquisition device positioned outside of said insulator for acquiring at least one optical signature when said insulator degrades;

(C) a light detector means, coupled to said optical acquisition device, for detecting said at least one optical signature and forming an electrical signal representative of said at least one optical signature; and (D) a signal processor, responsive to said electrical signal, for monitoring degradation of said insulator.

2. The apparatus of claim 1, wherein said optical acquisition device is disposed to receive at least one of said plurality of different distinctive optical signatures when at least one layer of said insulator degrades, wherein said light detector means includes means for generating a plurality of different electrical signals each of which corresponds to a different one of said plurality of different distinctive optical signatures, and wherein said signal processor includes means for individually monitoring degradation of each of said plurality of layers.

3. The apparatus of claim 2, wherein said plurality of different light producing materials are selected from the group consisting of sodium carbonate, titanium dioxide, calcium carbonate and sodium silicate.

4. A method for monitoring the condition of an electrical generator having at least one conductor, comprising the steps of:

(A) surrounding said at least one conductor with an insulator, said insulator having an interior surface adjacent to said at least one conductor and an exterior surface opposite said interior surface, said insulator having a depth spanning between said interior and exterior surfaces of said insulator, said insulator being formed of a plurality of overlapping layers positioned along said depth, each of said plurality of layers including an associated one of a plurality of different light producing materials, wherein each of said plurality of layers generates one of a plurality of different distinctive optical signatures upon degradation;

(B) acquiring at least one optical signature with an optical acquisition device positioned outside of said insulator when said insulator degrades;

(C) converting, with a light detector means coupled to said optical acquisition device, said at least one optical signature to an electrical signal; and (D) identifying degradation of said insulator by sensing said electrical signal with a signal processor.

5. The method of claim 4, wherein said optical acquisition device is disposed to receive at least one of said plurality of different distinctive optical signatures when at least one layer of said insulator degrades, further including means for generating a plurality of different electrical signals each of which corresponds to a different one of said plurality of different distinctive optical signatures, and wherein said signal processor includes means for individually monitoring degradation of each of said plurality of layers.

6. The method of claim 5, wherein said plurality of different light producing materials are selected from the group consisting of sodium carbonate, titanium dioxide, calcium carbonate and sodium silicate.

7. An apparatus for monitoring the condition of at least one electrical conductor, comprising:

(A) an insulator surrounding said at least one conductor, said insulator having an interior surface adjacent to said at least one conductor and an exterior surface opposite said interior surface, said insulator having a depth spanning between said interior and exterior surfaces of said insulator, said insulator being formed of a plurality of overlapping layers positioned along said depth, each of said plurality of layers including an associated one of a plurality of different light producing materials, wherein each of said plurality of layers generates one of a plurality of different distinctive optical signatures upon degradation;

(B) an optical acquisition device positioned outside of said insulator for acquiring at least one optical signature when said insulator degrades;

(C) a light detector means, coupled to said optical acquisition device, for detecting said at least one optical signature and forming an electrical signal representative of said at least one optical signature; and (D) a signal processor, responsive to said electrical signal, for monitoring degradation of said insulator.

8. The apparatus of claim 7, wherein said optical acquisition device is disposed to receive at least one of said plurality of different distinctive optical signatures when at least one layer of said insulator degrades, wherein said light detector means includes means for generating a plurality of different electrical signals each of which corresponds to a different one of said plurality of different distinctive optical signatures, and wherein said signal processor includes means for individually monitoring degradation of each of said plurality of layers.

9. The apparatus of claim 8, wherein said plurality of different light producing materials are selected from the group consisting of sodium carbonate, titanium dioxide, calcium carbonate and sodium silicate.

* * * * *